(12) United States Patent
Igarashi et al.

(10) Patent No.: US 8,876,173 B2
(45) Date of Patent: Nov. 4, 2014

(54) SUBSTRATE STORAGE POD AND LID OPENING/CLOSING SYSTEM FOR THE SAME

(75) Inventors: Hiroshi Igarashi, Tokyo (JP); Toshihiko Miyajima, Tokyo (JP); Tsutomu Okabe, Tokyo (JP)

(73) Assignee: TDK Corporation, Tokyo (JP)

( * ) Notice: Subject to any disclaimer, the term of this patent is extended or adjusted under 35 U.S.C. 154(b) by 607 days.

(21) Appl. No.: 13/041,786

(22) Filed: Mar. 7, 2011

(65) Prior Publication Data

US 2011/0215028 A1 Sep. 8, 2011

(30) Foreign Application Priority Data

Mar. 8, 2010 (JP) .................................. 2010-050311

(51) Int. Cl.
*E05C 1/06* (2006.01)
*E05F 11/02* (2006.01)
*B65D 85/00* (2006.01)

(52) U.S. Cl.
CPC ................. *E05F 11/02* (2013.01); *Y10S 292/11* (2013.01); *Y10S 292/25* (2013.01)
USPC .......... 292/144; 292/5; 292/6; 292/9; 292/12; 292/23; 292/41; 292/53; 292/63; 292/193; 292/DIG. 11; 292/DIG. 25; 414/411; 206/710

(58) Field of Classification Search
USPC ........... 414/217, 217.1, 411, 940; 292/2–6, 9, 292/14–16, 23, 32, 33, 38, 39, 41, 73–77, 292/137, 138, 142, 144, 156, 157, 159, 160, 292/163, 164, 172, 174, 179, 193, 256.6, 292/DIG. 11, DIG. 25, DIG. 55, 11, 12, 44, 292/45, 53, 57–60, 63, 194, 213, 227, 229; 70/77–82, 158, 163, 164, 275, 277, 70/278.1, 280; 206/454, 710, 711; 220/315, 324

See application file for complete search history.

(56) References Cited

U.S. PATENT DOCUMENTS 2,270,219 A * 1/1942 Persson ............................ 292/5
4,063,763 A * 12/1977 van Herpen ..................... 292/39

(Continued)

FOREIGN PATENT DOCUMENTS

| JP | 11-513006 | 11/1999 |
| JP | 2001-77177 | 3/2001 |

(Continued)

OTHER PUBLICATIONS

U.S. Appl. No. 13/035,425, filed Feb. 25, 2011, Okabe, et al.

*Primary Examiner* — Kristina Fulton
*Assistant Examiner* — Alyson M Merlino
(74) *Attorney, Agent, or Firm* — Oblon, Spivak, McClelland, Maier & Neustadt, L.L.P.

(57) ABSTRACT

The substrate storage pod includes an engagement portion in an outer side surface of a lid of the pod, and an insertion slot through which the engagement portion can be accessed from an external space; the insertion slot is formed in a flange portion arranged around the periphery of an opening in the pod and into which the lid can be fitted, and a latch mechanism supported so as to be slidable in a direction parallel to a flange side wall in a pod main body-surface of the flange portion. An engaging portion of the latch mechanism reaches the engagement portion via the insertion slot. The engagement portion is switched between an engaged state and a non-engaged state in response to movement of the latch mechanism.

11 Claims, 18 Drawing Sheets

(56) References Cited

U.S. PATENT DOCUMENTS

| | | | |
|---|---|---|---|
| 5,118,145 A * | 6/1992 | Tucker | 292/158 |
| 5,253,903 A * | 10/1993 | Daley | 292/39 |
| 5,373,716 A * | 12/1994 | MacNeil et al. | 70/109 |
| 5,481,889 A * | 1/1996 | Richard et al. | 70/118 |
| 5,673,950 A * | 10/1997 | Takimoto | 292/197 |
| 5,782,114 A * | 7/1998 | Zeus et al. | 70/109 |
| 5,820,234 A * | 10/1998 | Capwell et al. | 312/216 |
| 6,086,121 A * | 7/2000 | Buckland | 292/34 |
| 6,105,752 A * | 8/2000 | Liebich et al. | 198/747 |
| 6,105,782 A * | 8/2000 | Fujimori et al. | 206/710 |
| 6,186,331 B1 * | 2/2001 | Kinpara et al. | 206/711 |
| 6,281,516 B1 * | 8/2001 | Bacchi et al. | 250/559.29 |
| 6,390,145 B1 | 5/2002 | Igarashi et al. | |
| 6,398,475 B1 * | 6/2002 | Ishikawa | 414/217 |
| 6,430,802 B1 * | 8/2002 | Miyajima | 29/464 |
| 6,457,598 B1 * | 10/2002 | Hsieh et al. | 220/323 |
| 6,622,883 B1 * | 9/2003 | Wu et al. | 220/323 |
| 6,623,051 B2 * | 9/2003 | Bonora | 292/330 |
| 6,641,349 B1 * | 11/2003 | Miyajima et al. | 414/217 |
| 6,681,604 B1 * | 1/2004 | Samsel | 70/78 |
| 6,796,763 B2 * | 9/2004 | Miyajima et al. | 414/805 |
| 6,902,063 B2 * | 6/2005 | Pai et al. | 206/710 |
| 6,984,097 B1 | 1/2006 | Saeki et al. | |
| 7,370,890 B2 * | 5/2008 | Samsel | 292/42 |
| 7,828,341 B2 * | 11/2010 | Hasegawa et al. | 292/44 |
| 2010/0059408 A1 * | 3/2010 | Igarashi et al. | 206/710 |
| 2010/0117377 A1 | 5/2010 | Okabe et al. | |
| 2010/0133270 A1 * | 6/2010 | Okabe et al. | 220/212 |
| 2011/0210042 A1 * | 9/2011 | Okabe et al. | 206/710 |
| 2011/0215028 A1 * | 9/2011 | Igarashi et al. | 206/710 |

FOREIGN PATENT DOCUMENTS

| | | |
|---|---|---|
| JP | 3417821 | 4/2003 |
| JP | 2010087455 A * | 4/2010 |
| JP | 2010118385 A * | 5/2010 |
| JP | 2011035419 A * | 2/2011 |
| JP | 2011151417 A * | 8/2011 |
| JP | 2011181561 A * | 9/2011 |
| JP | 2011187615 A * | 9/2011 |
| JP | 2011187866 A * | 9/2011 |
| WO | WO 97/02199 | 1/1997 |

\* cited by examiner

SUBSTRATE STORAGE POD AND LID OPENING/CLOSING SYSTEM FOR THE SAME

BACKGROUND OF THE INVENTION

1. Field of the Invention

The present invention relates to what is called a FIMS (Front-Opening Interface Mechanical Standard) system used to transfer wafers held inside conveyance containers called pods, between semiconductor processing apparatuses during semiconductor manufacturing processes. More specifically, the present invention relates to a substrate storage pod (pod) called a FOUP (Front-Opening Unified Pod), that is, a closed container used in the FIMS system and in which wafers are accommodated, as well as a lid opening/closing system that is a FIMS system configured to open and close a lid of the pod and to transfer the wafers to and from the pod.

2. Description of the Related Art

In recent years, in semiconductor manufacturing processes, only the inside of processing apparatuses, pods, and a mini-environment space through which substrates are delivered from the pods to the processing apparatuses are held in a high cleanliness state. The cleanliness of the other spaces is maintained at a certain level. The pod includes a shelf inside which a plurality of wafers can be held parallel to one another at intervals, a generally cubic-shaped pod case with an opening formed in one surface forming an outer surface thereof and though which the wafers are loaded and unloaded, and a lid configured to close the opening. Pods with the opening formed in one side surface (the surface located opposite a mini-environment space) of the pod instead of the bottom surface thereof are generally called FOUPs described above.

Furthermore, the above-described mini-environment space includes an opening portion located opposite the opening in the pod, a door configured to close the opening portion, another processing apparatus-side opening portion formed in a semiconductor processing apparatus side, and a transfer robot configured to enter the pod through the opening portion to hold a wafer and to covey the wafer to the processing apparatus side through the another processing apparatus-side opening portion. Additionally, a configuration forming the mini-environment space includes a mounting platform configured to support the pod so that the pod opening just faces to the front outer surface of the door. The mounting platform includes a positioning pin arranged on the upper surface thereof and fitted into a positioning slot formed in the lower surface of the pod to define a position where the pod is mounted, and a clamp unit also arranged on the upper surface of the mounting platform and engaged with a clamp portion provided on the pod lower surface to fix the pod to the mounting platform. The mounting platform can normally move a predetermined distance forward and backward with respect to the door. To allow a wafer in the pod to be transferred to the processing apparatus, first, the pod mounted on the mounting platform is moved until the lid of the pod comes into contact with the door. After the lid comes into contact with the door, the lid is removed from the pod opening portion by the door. These operations allow the inside of the pot to communicate with the inside of the processing apparatus via the mini-environment space. The operation of transferring a wafer is subsequently repeated. The mounting platform, the door, the opening portion, a door opening/closing mechanism, a wall in which the opening portion is formed and which forms a part of the mini-environment space, and the like as a whole are called a FIMS system described above.

For example, as disclosed in Japanese Patent Application Laid-Open No. 2001-077177, a conventional pod includes a fitting slot arranged in an inner surface of a pod case in the vicinity of an opening thereof, and a lid with a pawl that can be extended and retracted outward from the outer periphery of the lid. According to this scheme, the lid is fitted into the pod case by insertion in a predetermined manner, and the pawl of the lid is extended. The extended pawl is inserted into the fitting slot in the pod case to fix the lid to the pod case. Furthermore, the above-described operation is reversely performed to unfix the lid from the pod case. The pawl is generally extended and retracted by fitting what is called a key member, from the outside of the lid surface, into an operating portion connected to the pawl and arranged at a predetermined position in a central area of the lid, and then operating the key member. The contact and pivoting of the above-described member, the resultant sliding and the like normally result in dusting, which may affect semiconductor manufacturing and which thus needs to be acknowledged as a problem. However, the dust is migrated to the mini-environment space in which a down flow is formed before the dust diffuses through the micro gap between the surface of the lid and the surface of the door to the outside of the gap. Thus, the diffusion of the dust into the mini-environment space or the pod is not so serious as to be acknowledged as a problem. Hence, no specific action has been taken on the dust. Furthermore, the pod is normally conveyed in a space with a lower cleanliness. Thus, dust may be attached, in the space, to the outer peripheral surface of the pod main body and the surface of the lid, or for example, hydrocarbon contained in the air may be stuck thereto. The suppressive effect based on the down flow is expected to work suitably on this problem as well as on the dust resulting from the operation of the above-described key member or the like.

For semiconductor devices, progressive effort has been made to enhance the functions of elements and to miniaturize the elements. Thus, a wiring width, design rules and the like used for the elements have been reduced. As a result, the presence of the smaller dust, which conventionally poses no problem, needs to be noted. Such micro dust, unlike the dust against which measures are conventionally taken, migrates through the space based on an operation different from the conventional one, such as what is called Brownian motion or the effect of micro static electricity. Specifically, even with an attempt to allow the above-described down flow to sweep such micro dust away to below the mini-environment space and to further discharge the micro dust to an external space, the micro dust is not simply swept away by a gas flow but may float into the mini-environment space. Japanese Patent No. 3417821 discloses a configuration including a pivoting lever arranged outside the pod-side opening instead of the pawl arranged on the lid so that with the opening closed by the lid, the lever presses and holds the lid from the lid surface side. In this configuration, generation of dust resulting from the operation of the key member as described in Japanese Patent Application Laid-Open No. 2001-077177 occurs around the periphery of the opening. Thus, the level of diffusion of the dust from the lid and from the door holding the lid may be reduced compared to that in the configuration disclosed in Japanese Patent Application Laid-Open No. 2001-077177. However, the lever needs to be operated before the lid is opened or closed, and a configuration for this operation is present around the periphery of the opening portion. Hence, the micro dust present in the external space may diffuse toward the mini-environment space.

Furthermore, a recent increase in the diameter of wafers has led to an increase in the size of pods in which wafers are accommodated. In such a large-sized pod, when the lid of the pod is closed, the door configured to hold the lid performs a significant amount of operation, and a strong driving force needs to be exerted for the closure. Thus, in the conventional relationship between the door and the pod lid, it is expected to be difficult to suitably fix the pod lid to the pod simply by operating the door. Hence, the need arises to suppress the adverse effect of micro dust stuck to the surface of the lid configured to close the pod opening and to restrain generation of dust resulting from an opening or closing operation performed when the lid is opened or closed as well as diffusion of the generated dust into the mini-environment space or the inside of the pod.

SUMMARY OF THE INVENTION

A purpose of the present invention is to provide a substrate storage pod (or pod) that is a closed container configured to suppress the adverse effect of micro dust stuck to the surface of a lid configured to close a pod opening and to restrain generation of dust resulting from an opening or closing operation performed when the lid is opened or closed as well as diffusion of the generated dust into a mini-environment space or the inside of the pod, and a lid opening/closing system associated with the closed container.

Another purpose of the present invention is to provide a closed container that is a pod for large-size wafers which enables an opening in the pod to be reliably closed, and a lid opening/closing system associated with the closed container.

A further purpose of the present invention is to provide a substrate storage pod including a pod case having an opening with a seat portion provided around a periphery thereof and an inner space with a processing substrate housed therein, and a lid which is capable of being fit-inserted to the opening so that a back surface of the lid is pushed onto the seat of the pod case so as to close and seal the opening, wherein the pod case includes a latch mechanism movably attached to the pod case, the latch mechanism including an arm portion projecting in a direction different from a direction of movement of the latch mechanism and an engaging portion attached to a leading end of the arm portion, wherein the lid comprises an engagement portion, the engagement portion including a first groove provided on a side surface of the lid and a second groove provided in such a manner that the second groove communicates with the first groove at one end thereof and also communicates, at another end thereof, with a surface of the lid which faces to the inner space, when the lid is completely fitted into the opening by insertion, wherein the engaging portion of the latch mechanism enters in the second groove while the lid is inserted into the opening and moves through the first groove according to movement of the latch mechanism in contact with an inner side wall surface of the first groove wherein the inner side wall rises on a side of the inner space of the pod case, a direction in which the inner side wall surface of the first groove extends and a direction in which the latch mechanism moves cross so as to be narrower in a direction toward a portion where the first groove is connected to the second groove, when the latch mechanism moves in a direction opposite to the direction in which a distance between the first and the second grooves becomes narrow, the lid is pressed against and firmly fixed to the seat portion, and when the latch mechanism moves along the inner side wall surface of the first groove to the second groove in the direction in which a distance between the first and the second grooves becomes narrow, the lid is released from the opening.

A still further purpose of the present invention will be apparent from the following detailed description and accompanying drawings.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

Figure 1A:
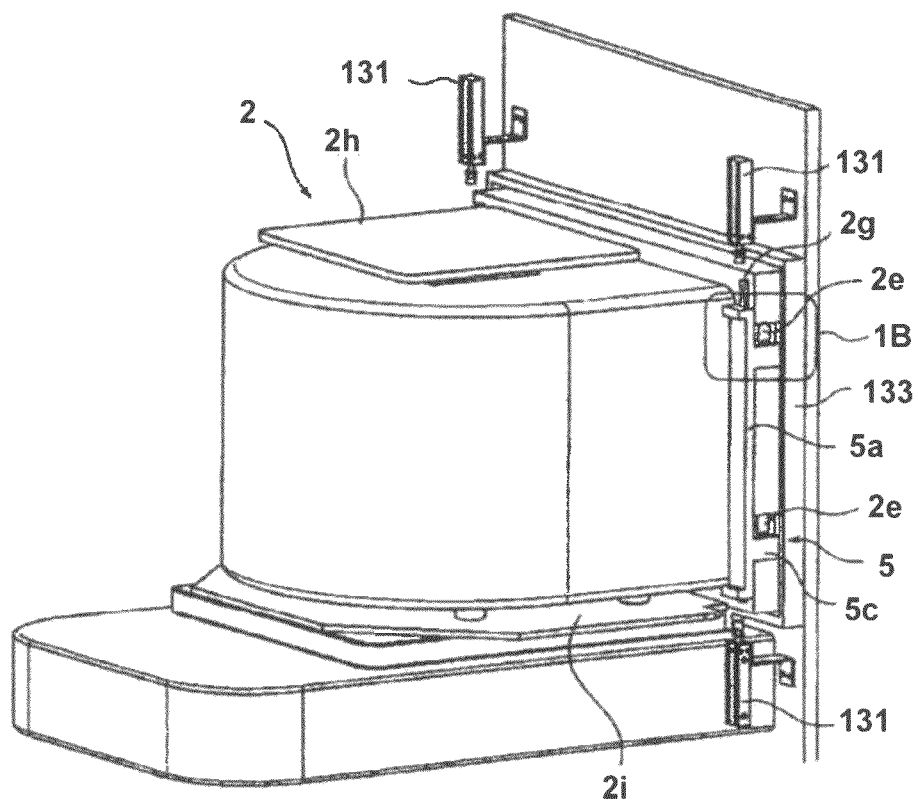
FIG. 1A is a perspective view schematically showing the structure of essential parts of a pod and a corresponding lid opening/closing system according to an embodiment of the present invention.
Figure 1B:
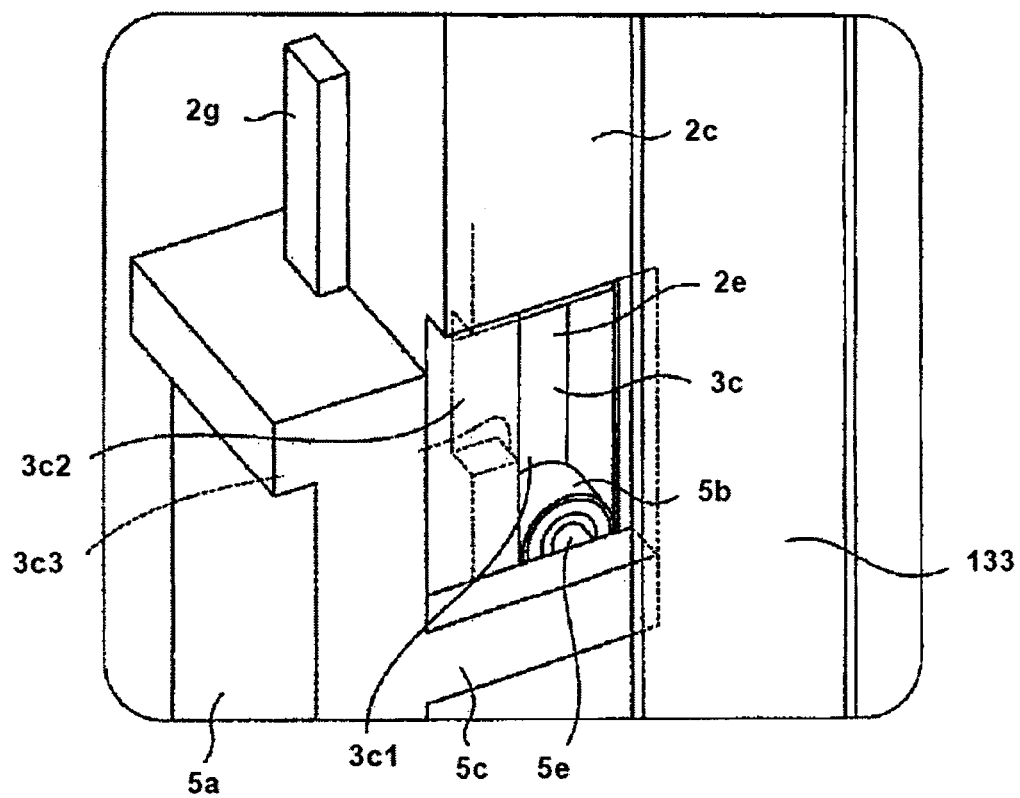
FIG. 1B is an enlarged diagram showing a configuration included in an area 1B in FIG. 1A.
Figure 2:
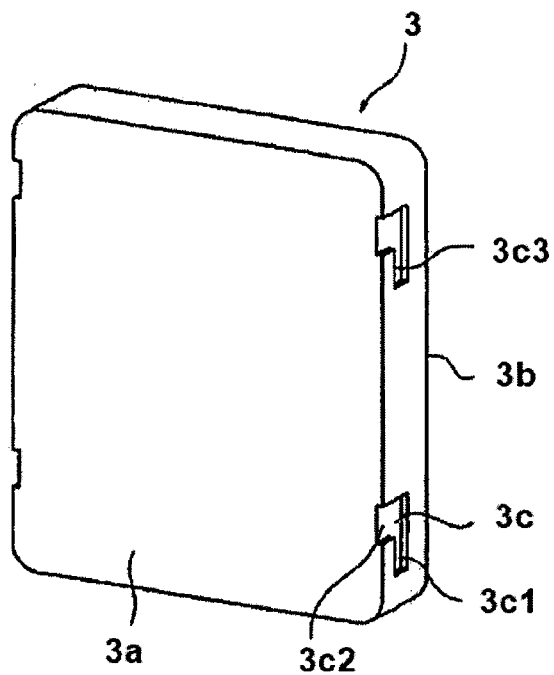
FIG. 2 is a perspective view showing the structure of a lid of the pod shown in FIG. 1A.
Figure 3:
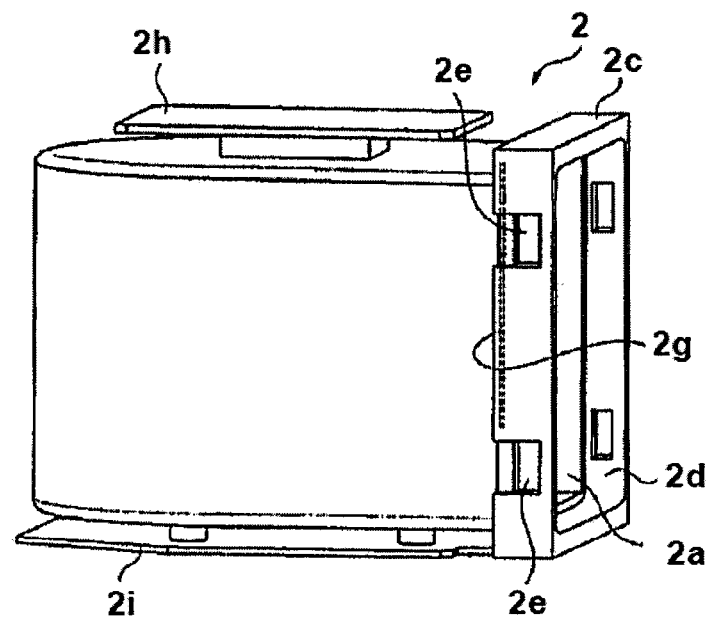
FIG. 3 is a perspective view showing the structure of the pod main body of the pod shown in FIG. 1A.
Figure 4:
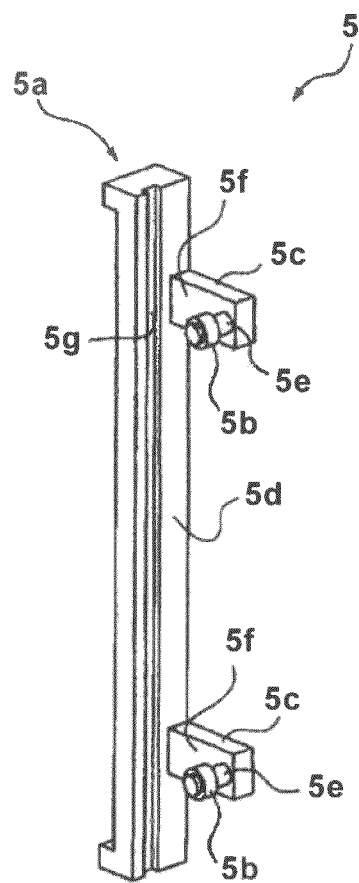
FIG. 4 is a perspective view showing the structure of a latch mechanism of the pod shown in FIG. 1A.
Figure 5A:
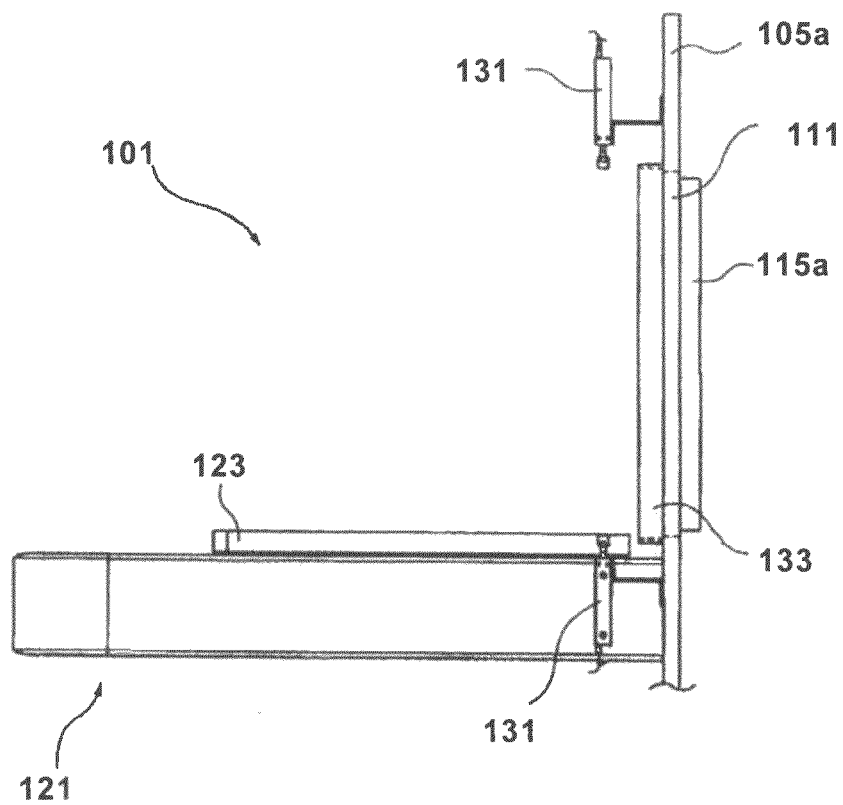
FIG. 5A is a schematic diagram showing an essential part of the lid opening/closing system shown in FIG. 1A, as seen from the side of the system.
Figure 5B:
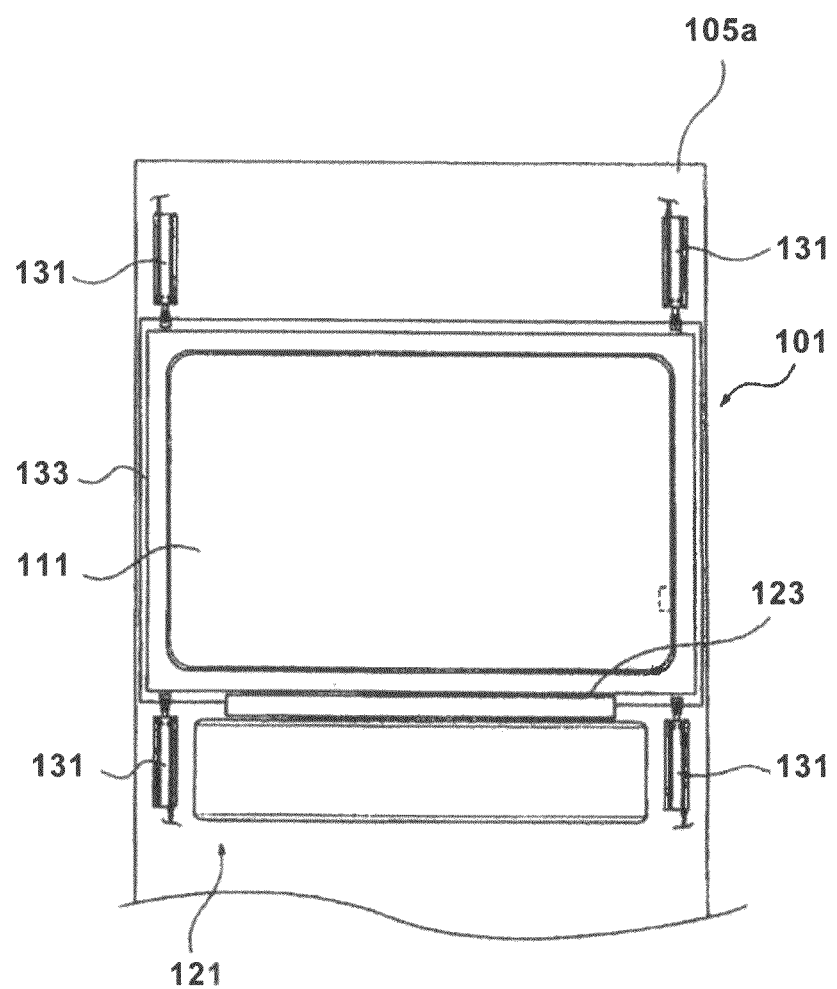
FIG. 5B is a schematic diagram of the essential part shown in FIG. 5A, as seen from the front, external-space-side of the system.
Figure 6A:
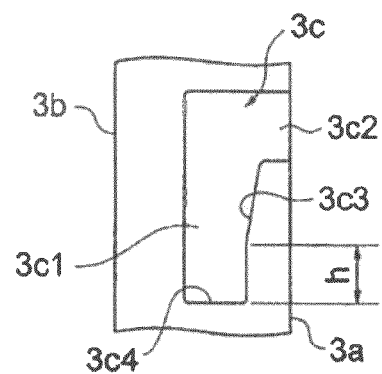
FIG. 6A is a diagram showing the shape of an engaging recess portion 3c according to an embodiment of the present invention as seen from the front of the engaging recess portion 3c.
Figure 6B:
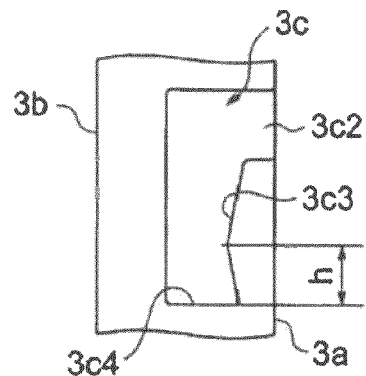
FIG. 6B is a diagram showing the shape of an engaging recess portion 3c according to another embodiment of the present invention as seen from the front of the engaging recess portion 3c.
Figure 7A:
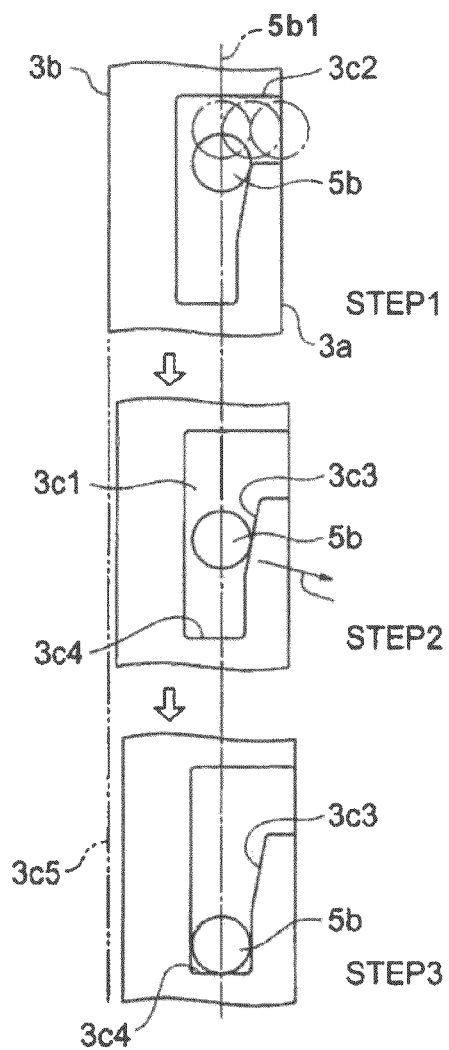
FIG. 7A is a diagram showing, in a stepwise fashion, how the latch mechanism acts on the engaging recess portion 3c shown in FIG. 6A.
Figure 7B:
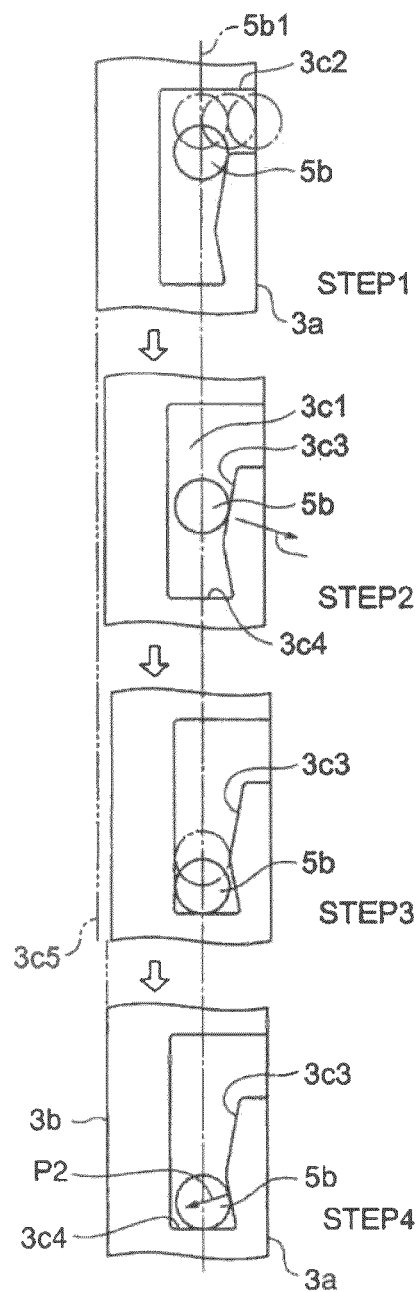
FIG. 7B is a diagram showing, in a stepwise fashion, how the latch mechanism acts on the engaging recess portion 3c shown in FIG. 6B.

Now, an embodiment of the present invention will be described below with reference to the drawings. FIG. 1A shows that a pod that is a closed container according to an embodiment of the present invention is present at a lid opening/closing position on a FIMS that is a lid opening/closing system; FIG. 1A is a perspective view of these components. Furthermore, FIG. 1B shows how a roller portion of a latch mechanism described below is engaged in the state shown in FIG. 1A; FIG. 1B is an enlarged diagram of the configuration of an area 1B. FIG. 2 is a schematic perspective view of a lid of the pod. FIG. 3 is a schematic perspective view of the main body of the pod. Furthermore, FIG. 4 is a schematic perspective view of the latch mechanism fixed to the pod main body. Moreover, FIG. 5A shows a mounting platform and a wall forming an opening portion of a mini-environment space as seen from the side of the system. FIG. 5B shows the components shown in FIG. 5A as seen from the front of the system through which the pod is mounted. Additionally, FIGS. 6A and 6B are diagrams showing the shape of an engagement recess portion described below as seen from the front of the engagement recess portion. FIGS. 7A and 7B are diagrams schematically illustrating operations of the latch mechanism and the lid with the engagement recess portion performed when the lid is fixed to the pod main body.

A pod 1 that is the closed container according to the present invention includes a pod main body 2 that is a container main body, a lid 3, and a latch mechanism 5 slidably attached to the pod main body 2. The pod main body 2 is shaped generally like a cube and contains an inner space in which a plurality of accommodated articles such as wafers are accommodated so as to be juxtaposed in the height direction of the pod main body 2. The pod main body can take any of various forms in which wafers can be accommodated. However, the pod main body is shaped basically like a cube and is thus defined to be shaped generally like a cube. The pod main body 2 includes an opening 2a formed in one side surface of the generally cubic shape and which is in communication with the inner space. The opening 2a allows the inner space to communicate with an external space. On this side surface, a flange portion 2c is formed so as to surround the periphery of the opening 2a; the flange portion 2c juts outward from the periphery of the opening 2a in a plane parallel to an opening plane containing the opening 2a. The flange portion 2c includes a side end opening surface located parallel to the above-described side surface and faces to an opening peripheral wall of a load port serving as a lid opening/closing system described below. The flange portion 2c forms an accommodation space 2d with a thickness equal to or greater than that of the lid 3 and almost the same size as that of one planar surface (a back surface 3a described below) of the planar lid 3 so that the lid 3 can be fitted into the pod main body 3 to enable the opening 2a to be closed. In the accommodation space 2d, a seat portion serving as a step is formed around the periphery of the opening 2a. The lid 3 is fitted into the opening 2a by insertion to come into tight contact with the seat portion. As a result, the opening 2a is closed.

Furthermore, rectangular roller portion insertion slots 2e are formed in the outer peripheral surface of the flange portion 2c, in the present embodiment, the outer side surface of the flange portion 2c, so as to serve as insertion slots that are in communication with the accommodation space 2d from external space. The upper and lower roller portion insertion slots 2e are arranged in each of the opposite outer side surfaces of the flange portion 2c. Additionally, in the present embodiment, the flange portion 2c includes a slide rail 2g in which the latch mechanism 5 is slidably supported. The slide rail 2g is provided on the back side surface that is a surface opposite to the above-described side end opening surface of the flange portion 2c (the back surface is positioned closer to the main body of the pod case). The slide rail 2g is located adjacent to the outer side surface and extends in a direction of extension in which the outer side surface extends. Moreover, the pod main body 2 includes a fixing flange 2h located at the top thereof and held by a pod conveying robot (not shown in the drawings) and a fixing flange 2i located at the bottom thereof and on which a engagement portion (not shown in the drawings) that actually abuts on and is fixed to the mounting platform is arranged. The fixing flange 2h and the fixing flange 2i have no relationship with the characteristic configuration of the pod according to the present invention and will thus not be described.

The lid 3 according to the present embodiment is formed of a plate shape member with a front surface opposite to the back surface 3a that faces the inner space of the pod when the opening 2a in the pod main body 2 is closed and a front surface 3b located closer to the external space. Furthermore, the lid 3 includes paired engagement recess portions 3c arranged in the planar outer peripheral surface thereof, in the present embodiment, the outer side surface thereof, in association with the upper and lower positions corresponding to the roller portion insertion slots 2e in the above-described pod main body 2. The engagement recess portion 3c, serving as an engagement portion, has an L shape formed of a first groove 3c1 carved on and along the outer side surface of the lid 3 with the engagement recess portions 3c formed therein and a second groove 3c2 which is in communication with the first groove 3c1 at one end thereof and with the inner space-side surface (back surface) 3a of the lid 3 at the other end thereof when the lid 3 is completely fitted into opening 2a by insertion; the other end of the second groove 3c2 is thus open. The length and width of the first groove are equal to those of the roller portion insertion slot 2e formed in the pod main body 2. Furthermore, an inner side wall 3c3 positioned in the first groove 3c1 on the back surface 3a side of the lid 3 and forming a part of an engaging recess portion functions as an acting surface with which a roller portion 5b described below moves in contact and which allows the lid 3 to be pulled to the pod main body 2. The front surface 3b of the lid 3 is subjected to surface polishing treatment in a stacked area to be stuck to and held by an absorption pad on a door described below, so as to enable efficient suction and holding. Here, dust or the like is adhered on the lid front surface 3b during conveyance of the pod though a space with a lower cleanliness. Thus, in order to allow the absorption pad to seal the lid to prevent diffusion into the mini-environment space, the stacked area is preferably configured to cover almost all the area of the front surface 3b.

Now, the configuration of the engagement recess portion 3c will be described with reference to FIG. 6A. The width of the first groove 3c1 varies in the direction of extension in which the planar shape extends instead of being constant in this direction. Specifically, in an area that is in communication with the second groove 3c2, the width increases toward the lid back surface 3a and decreases toward a blocked end 3c4 of the first groove 3c1. The width remains constant from a position located at a predetermined distance h from the blocked end. Thus, the inner side wall 3c3 forms an inclined surface such that the distance from the lid back surface 3a to the inclined surface is shortest in the vicinity of an opening portion continuous with the second groove 3c2 and increases with decreasing distance to the blocked end 3c4. The inner side wall 3c3 remains parallel to the lid back surface 3a from the position located at the predetermined distance h from the blocked end. The effect of the shape of the engagement recess portion 3c will be described with reference to FIG. 7A. FIG. 7A shows a change in the positional relationship between the engagement recess portion 3c and the roller portion 5b observed when the lid 3 is fixed to the pod main body 2. In FIG. 7A, a center line 5b1 shown by an alternate long and short dash line corresponds to a moving axis line of the roller portion 5b. An alternate long and two short dashes line indicates the position of the front surface 3b of the lid 3 obtained when the door described below brings the lid 3 into abutting contact with the pod main body 2, the alternate long and two short dashes line corresponds to a schematic aspect line 3c5 of the position of the front surface 3b. Furthermore, FIG. 7A sequentially shows changes in the positional relationship between the lid 3 and the roller portion 5b in accordance with process steps from the top to bottom of the sheet of the drawing. In step 1, an operation of attaching the lid 3 to the pod main body 2 is performed. First, the roller portion 5b is fitted into the second groove 3c2, and moves toward the first groove 3c1 until the lid 3 is pushed in to a predetermined position. Then, when the front surface 3b of the lid 3 reaches the predetermined position 3c5, the movement of the lid 3 caused by the door (not shown in the drawings) is stopped. Then, the latch mechanism described below drives the roller portion 5b, which thus starts moving toward the blocked end 3c4 of the lid 3 along the moving axis line. During movement on the axis line, the roller portion 5b comes into abutting contact with the inclined surface of the inner side wall 3c3 to apply a pressing force P acting in a direction in which the lid 3 is pressed against the pod main body 2, to the inclined surface. Under the pressing force P, the lid 3 is pushed in toward the pod main body 2 and moves toward the back surface 3a of the lid 3 with respect to the schematic aspect line 3c5 as shown in step 2. The roller portion 5b further moves and reaches the area with the constant width. Then, as shown in step 3, the push-in of the lid 3 is stopped, and the lid 3 is fixed to the pod main body 2 in close contact therewith under a predetermined load.

Now, another form of the engagement recess portion 3c will be described with reference to FIGS. 6B and 7B. Description of parts, components, steps and the like which are similar to those in FIGS. 6A and 7A is omitted, and only differences from the above-described engagement recess portion 3c will be described. In the embodiment shown in FIGS. 6B and 7B, the second groove 3c2 is provided to be carved such that the distance between the surface of the inner side wall 3c3 and the back surface 3a of the lid decreases with increasing distance from a position located at a predetermined distance from a point in the second groove 3c2 where the second groove 3c2 is in communication with the first groove 3c1, with respect to the point where the second groove 3c2 is in communication with the first groove 3c1. That is, the direction of inclination of the inner side wall 3c3 changes at the position (the position located at a distance h from the blocked end 3c4 in FIG. 6A and FIG. 6B) located at the predetermined distance from the point where the second groove 3c2 is in communication with the first groove 3c1. Thus, the distance between the inner side wall 3c3 and the back surface 3a of the lid 3 increases from the position of the predetermined distance. With the second groove 3c2 shaped this way, operations of the lid 3 and the like performed when the roller portion 5b actually approaches the blocked end 3c4 will be described with reference to FIG. 7B. The relative operation between the roller portion 5b and the lid 3 from step 1 to step 3 is as described above in FIG. 7A. However, in the present embodiment, when the roller portion 5b moves beyond the position of the predetermined distance h and closer to the blocked end 3c4, the pressing force P exerted on the inner side wall 3c3 by the roller portion 5b is weakened to move the lid 3 slightly back from the position where the lid 3 is pressed against the pod main body 2 to a maximum extent, toward the initial position. That is, as shown in step 4, the lid 3 moves from the position shown in step 3 toward the lid front surface 3b. The inner side wall 3c3 forming a reversely inclined surface toward the terminal thereof applies a return force P2 to the roller portion 5b. In this state, the roller portion 5b is pressed against the blocked end 3c3 by the return force P2. This state corresponds to a case where an external factor acts on the pod or the like, with the roller portion 5b constantly fixed to the blocked end 3c4.

Now, the latch mechanism 5 will be described in detail. The latch mechanism 5 is attached to the pod main body 2 so as to be movable with respect to the pod main body 2. For example, a typical direction in which the latch mechanism 5 moves is along the outer peripheral surface of the flange portion 2c. The latch mechanism 5 includes a latch main body portion 5a, the roller portions 5b serving as engagement portions, and arm portions 5c coupling the latch main body portion 5a to the roller portion 5b. The latch main body portion 5a is a prismatic member extending in the direction of movement of the latch mechanism 5. A first opposing surface 5d of the latch main body portion 5a and a second opposing surface 5f of the arm portion 5c are located opposite the back surface and side surface, respectively, of the flange portion 2c of the pod main body 2. The first opposing surface 5d includes a guide groove 5g extending on the first opposing surface 5d in the direction of extension of the latch main body portion 5a so that the above-described slide rail 2g can be slidably accommodated in the guide groove 5g. The latch mechanism 5 is not limited to the prismatic member but may be a cylindrical member or a block member. The latch mechanism 5 is attached to the pod main body 2 so as to be movable with respect to the pod main body 2. The arm portions 5c project from the formation surface of the first opposing surface 5d in a direction different from the direction of extension of the latch main body portion 5a (for example, the arm portion 5c projects perpendicularly to the first opposing surface 5d). The paired arm portions 5c are arranged at an upper position and a lower position, respectively, on the latch main body portion 5a in association with the above-described roller portion insertion slots 2e. In the present embodiment, in actuality, the first opposing surface 5d and the second opposing surface 5f are located opposite the flange 2c at a very short distance from the flange 2c. This prevents possible abutment, sliding, or the like between the first or second opposing surface and the flange 2c. The arrangement of the above-described components, for example, the direction of projection of the arm portions 5*c* from the latch main body portion 5*a*, is not limited to the present embodiment. That is, the arm portions 5*c* project in a particular direction from the latch main body portion 5*a*, which is movable along one axis corresponding to the direction of extension. The roller portions 5*b* serving as the engagement portions are attached to the leading ends of the respective arm portions 5*c*.

Each of the roller portions 5*b* of the latch mechanism 5 enters the second groove 3*c*2 as the lid 3 is fitted into the opening 2*a* by insertion. Thereafter, as the latch mechanism 5 is moved, the roller portion 5*b* moves through the first groove 3*c*1 in contact with the inner side wall 3*c*3 of the first groove 3*c*1, which is located closer to the inner space.

The roller portion 5*b* projects into the lid accommodation space 2*d* via the corresponding roller portion insertion slot 2*e* formed in the flange portion 2*c*. The roller portion 5*b* is in abutting contact with a part of the inner side wall 3*c*3 of the corresponding above-described engagement recess portion 3*c*. The roller portion Sb is shaped like a circular-plate and pivotally supported by the arm portion 5*c* via a rotating shaft 5*e* that is perpendicular to the bottom surface of the roller portion 5*b*. The rotating shaft 5*e* extends in a direction perpendicular to each of the direction of extension of the latch main body portion 5*a* and the direction of projection of the arm portion 5*c*. In this configuration, when the roller portion 5*b* moves in a plane perpendicular to the rotating shaft 5*e* and parallel to the plane, that is, when the latch main body portion 5*a* slides in the direction of extension thereof, the roller portion 5*b* rolls around the rotating shaft 5*e*. Furthermore, the position is changed where the outer peripheral surface of circular plate shape of the roller portion 5*b* contacts the inner side wall, with the abutting contact with the inner side wall maintained. In the present embodiment, an elastic member such as rubber is stuck to the outer peripheral surface of circular plate shape of the roller portion 5*b* to make the circular plate shape elastic in the direction of the peripheral surface thereof. This prevents the abutting contact portion from sliding without rotating even during rotational movement of the roller portion 5*b*. As a result, dusting can be suppressed.

The direction of movement of the latch mechanism 5 may be, for example, parallel to the formation surface of the opening 2*a*. Alternatively, the direction may be angular to the surface of the lid 3 which is located closer to the inner space when the lid 3 is completely fitted into the opening 2*a* by insertion, that is, to the formation surface of the opening 2*a*. For example, a surface parallel to the formation surface of the opening 2*a* is formed on an outer wall of the flange 2*c* along the outer peripheral surface thereof. Then, upon being moved along this surface, the latch mechanism 5 moves parallel to the formation surface of the opening 2*a*. In this case, the latch mechanism 5 may move either in the vertical direction or in the horizontal direction.

When the outer wall of the flange 2*c* includes a surface formed along the outer peripheral surface of the flange portion 2*c* and angularly to the formation surface of the opening 2*a* and the latch mechanism 5 is moved along this surface, then the latch mechanism 5 can be moved in a direction angular to the formation surface of the opening 2*a*. When moving obliquely and angularly to the formation surface of the opening 2*a*, the latch mechanism 5 can be provided with a large moving stroke. When the latch mechanism 5 is moved to tighten the lid 3, the rate of change in the tightening force of the latch mechanism 5 can be reduced to enable precise tightening.

The direction of extension of the plane of the inner side wall 3*cc* of the first groove 3*c*1 crosses the direction of movement of the latch mechanism 5. The direction of extension of the plane of the inner side wall 3*c*3 angularly crosses the direction of movement of the latch mechanism 5 so that a direction in which the inner side wall surface of the first groove extends and a direction in which the latch mechanism moves cross so as to be narrower in a direction toward a portion where the first groove 3*c*1 is in communication with the second groove 3C2.

When the latch mechanism 5 moves in a direction opposite to that in which the crossing angle between the direction of extension of the surface of the inner side wall 3*c*3 and the direction of movement of the latch mechanism 5 decreases (in the direction in which the crossing angle increases), since the distance between the roller portion 5*b* and the first opposing surface 5*d* of the latch mechanism 5 is constant, the distance between the surface of the inner side wall 3*c*3 and the first opposing surface 5*d* of the latch mechanism 5 increases to allow a wedge effect to be exerted. Then, movement of the latch mechanism 5 allows the roller portion 5*b*, serving as the engagement portion, to pull the inner side wall 3*c*3 toward the latch mechanism 5. When the inner side wall 3*c*3 is pulled toward the latch mechanism 5, the lid 3 is pressed against and firmly fixed to the seat portion. On the other hand, when the latch mechanism 5 moves to the second groove 3*c*2 along the inner side wall 3*c*3 of the first groove 3*c*1 in the direction in which the crossing angle between the direction of extension of the surface of the inner side wall 3*c*3 and the direction of movement of the latch mechanism 5 decreases, the lid 3 is gradually unfixed.

In the present embodiment, as shown in FIG. 6A and FIG. 6B, the direction of inclination of the inner side wall 3*c*3 is changed at the position located at the predetermined distance h from the blocked end 3*c*4. That is, the predetermined position h in the present invention is significant in changing the direction of inclination of the inner side wall 3*c*3 so as to reduce the crossing angle between the direction of extension of the surface of the inner side wall 3*c*3 and the direction of movement of the latch mechanism 5. That is, initially, when the latch mechanism 5 moves in the direction in which the crossing angle between the direction of extension of the surface of the inner side wall 3*c*3 and the direction of movement of the latch mechanism 5 increases, the distance between the surface of the inner side wall 3*c*3 and the first opposing surface 5*d* of the latch mechanism 5 increases at certain increments. When the latch mechanism 5 is further moved and reaches the position of the predetermined distance h from the blocked end 3*c*4, the crossing angle between the direction of extension of the surface of the inner side wall 3*c*3 and the direction of movement of the latch mechanism 5 changes. This reduces the increment of the distance between the surface of the inner side wall 3*c*3 and the first opposing surface 5*d* of the latch mechanism 5. Thus, as described above, the position of the predetermined distance h from the blocked end 3*c*4 is set such that the lid 3 is pressed against the step of the opening 2*a* in the accommodation space of the pod main body 2 under an appropriate pressure, as is the case with step 3 in FIG. 7A and step 4 in FIG. 7B.

In the present embodiment, the slide rail 2*g* and the guide groove 5*g* allow the latch mechanism 5 to be attached to the pod main body 2. This eliminates the unwanted contact of the latch mechanism 5 with the pod main body 2, preventing possible dusting resulting from the contact. However, in order to allow the latch mechanism 5 to be firmly attached to the pod main body 2 to reduce what is called backlash during sliding of the latch mechanism 5, the latch mechanism 5 may be attached to the pod main body 2 by sandwiching a portion of the pod main body 2 located between one inner side wall of the rectangular roller portion insertion slot 2*e* and the slide rail 2*g*, between the guide groove 5*g* and a part of the outer peripheral surface of the circular plate shape of the roller portion 5*b*. In this case, when the outer peripheral surface of the circular plate shape of the roller portion 5*b* is made elastic, the roller portion 5*b* can be brought into abutting contact, under an appropriate pressing force, with the both the one inner side wall of the rectangular roller portion insertion slot 2*e* and the inner side wall 3*c*3 of the engaging recess portion. A certain amount of dust is inevitably generated at the abutting contact portions between the above-described members. Thus, dusting caused by the operation of the latch mechanism 5 can be suppressed by, for example, using a wear-resistant material or the like taking the wear characteristics of the abutting contact portions or using rollers formed of bearings and which are thus unlikely to dust.

Figure 9A:
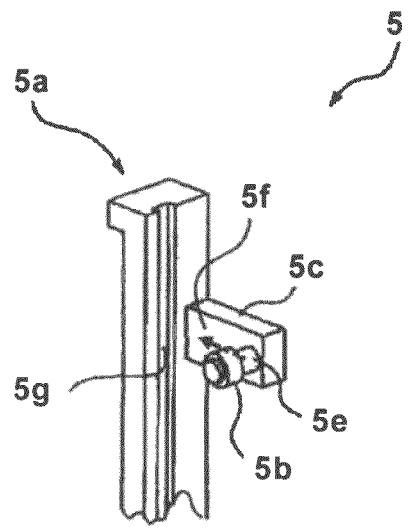
FIG. 9A is a perspective view illustrating how a biasing force is applied in the structure of the latch mechanism of the pod shown in FIG. 4.

Now, the manner in which the latch mechanism 5 opens the lid 3 with respect to the pod main body 2 will be described below. As shown in FIG. 1A, with the lid 3 accommodated in the accommodation space 2*d* of the pod main body 2 to close the opening 2*a*, the roller portion 5*b* is positioned below the roller insertion slot 2*e*, that is, at the blocked end 3*c*4 of the first groove 3*c*1 in the L-shaped engagement recess portion 3*c*. The latch mechanism 5 is positioned at the blocked end by the weight thereof. Moreover, as shown by an arrow in FIG. 9A, in the latch mechanism 5, a force is applied to the roller portion 5*b* in a direction in which the roller portion 5*b* approaches the latch main body portion 5*a*. This stabilizes the position of the roller portion 5*b* in the engagement recess portion 3*c*. For example, the rotating shaft 5*e* of the roller portion 5*b* may be fixed to the arm portion 5*c*, and an elastic member may be attached to the rotating shaft 5*e* so that a biasing force can be applied in the direction of extension of the arm portion 5*c* so as to retract the arm portion 5*c* with respect to the latch mechanism. A possible elastic member is a spring. In an alternative structure in which the rotating shaft 5*e* of the roller portion 5*b* is movable toward the latch main body portion 5*a* with respect to the arm portion 5*c*, one end of a spring is attached to the rotating shaft 5*e* of the roller portion 5*b*, whereas the other end of the spring is attached to the arm portion 5*c*. Then, a biasing force is applied in the direction of extension of the arm portion 5*c* so as to allow the roller portion 5*b* to approach the latch main body portion 5*a*. This allows the roller portion 5*b* to apply a biasing force in a direction in which the lid 3 is brought into close contact with the seat portion of the pod main body 2. The roller portion 5*b* receives a reaction force to the biasing force and is thus stably stopped at that position. In this state, the latch mechanism 5 is slid to a latch open position, that is, upward in FIG. 1A. Then, the roller portion 5*b* moves to a position in the L-shaped engagement recess portion 3*c* where the first groove 3*c*1 is in communication with the second groove 3*c*2. This movement positions the roller portion 5*b* in the second groove 3*c*2, opened in the lid back surface 3*a*. Thus, the roller portion 5*b* does not come into abutting contact with any part of the inner side wall 3*c*3. Therefore, the regulation placed on the lid 3 by the roller portion 5*b* is eliminated, enabling the lid 3 to move in the direction of extension of the second groove 3*c*2, that is, in a direction in which the lid 3 is brought away from the pod opening 2*a*.

Figure 9B:
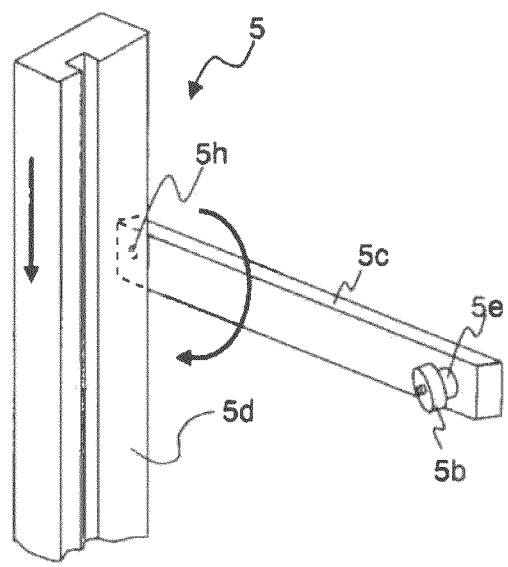
FIG. 9B is a perspective view illustrating how the biasing force is applied to an arm portion of the latch mechanism.

In the latch mechanism 5, the following configuration may be used to apply a force in the direction in which the roller portion 5*b* approaches the latch main body portion 5*a*. The arm portion 5*c* is pivotally movably fixed to the latch main body portion 5*a* by a pivotal shaft 5*h*, and a force is applied such that the roller portion 5*b* rotationally approaches the latch main body portion 5*a*, as shown by an arrow in FIG. 9B. For example, a biasing force may be applied using an elastic member (for example, a spring) installed so as to surround the pivotal shaft 5*h* with one end thereof attached to the arm portion 5*c* and the other end thereof attached to the latch main body portion 5*a*. The biasing force in this case is such a torque as subjects the arm portion 5*c* to a force in the direction of extension of the first groove 3*c*1 with respect to the second groove 3*c*2 in the engagement recess portion 3*c*. For example, as seen in FIG. 9B, provided that the latch mechanism 5 is moved downward to fix the lid 3 to the pod main body 2, a force in the direction of movement of the latch mechanism 5 is applied to the arm portion 5*c* with a torque because the first groove 3*c*1 is carved downward with respect to the second groove 3*c*2 in the engagement recess portion 3*c*. This means that a biasing force acts around the pivotal shaft 5*h* in a direction in which the inner side wall of the first groove 3*c*1 approaches the latch mechanism 5. That is, in this case, the biasing force is exerted to generate such a torque as allows a downward force to be applied to the arm portion 5*c* as shown in FIG. 9B.

Figure 9C:
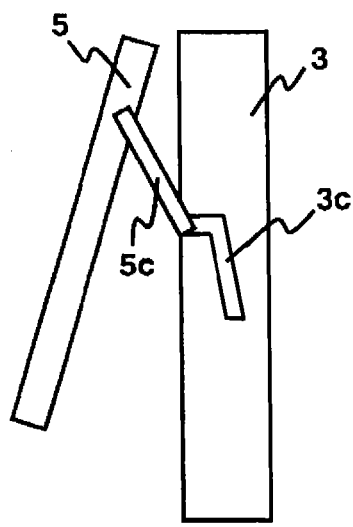
FIG. 9C is a schematic diagram showing movement of the latch mechanism and motion of the arm portion in the case of the use of the latch mechanism shown in FIG. 9B.
Figure 9D:
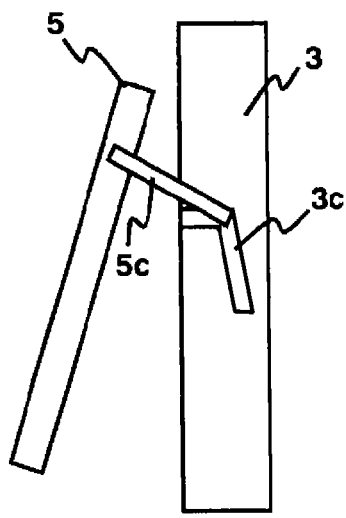
FIG. 9D is a schematic diagram showing movement of the latch mechanism and motion of the arm portion in the case of the use of the latch mechanism shown in FIG. 9B.
Figure 9E:
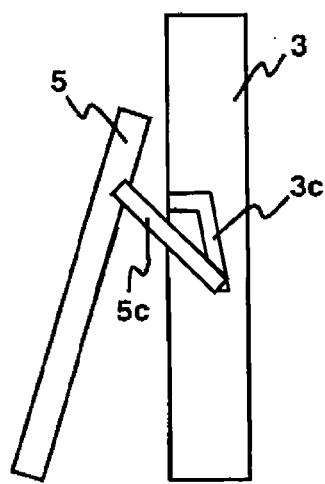
FIG. 9E is a schematic diagram showing movement of the latch mechanism and motion of the arm portion in the case of the use of the latch mechanism shown in FIG. 9B.

In this configuration, movement of the latch mechanism 5 in the engagement recess portion 3*c* allows the lid 3 to be fixed as shown in FIG. 9C to FIG. 9E. FIG. 9C to FIG. 9E are schematic diagrams illustrating movement of the latch mechanism and motion of the arm portion in the case of the use of the latch mechanism shown in FIG. 9B. As shown in FIG. 9C, first, when the lid 3 is inserted into the opening 2*a*, the roller portion 5*b* is inserted into the second groove 3*c*2. The arm portion 5*c* is spontaneously opened as the roller portion 5*b* advances through the second groove 3*c*2. As the latch mechanism 5 further moves, the roller portion 5*b* spontaneously changes its direction in response to the biasing force exerted on the arm portion 5*c* and moves from the second groove 3*c*2 toward the first groove 3*c*1. When the latch mechanism 5 finishes the movement, the roller portion 5*b* is stopped and held at the blocked end 3*c*4 of the first groove 3*c*1 by the biasing force. The lid 3 is firmly pressed against the seat portion of the opening 2*a*. The blocked end 3*c*4 of the first groove 3*c*1 may be set such that the direction of the first groove 3*c*1 is changed so as to coincide with the direction of the biasing force exerted on the arm portion 5*c*.

In the above-described embodiment, the paired latch mechanisms 5 are each arranged on one corner of the back surface of the corresponding side of the flange portion 2*c*. In the present embodiment, the latched state is obtained by the weight of the latch mechanism 5, and a mechanism is not particularly required which maintains the latch mechanism 5 in position when the pod is stored. Thus, the configuration of the pod can be effectively simplified. Such a simple configuration allows dust to be easily washed away and enables a reduction in the possibility that dust adheres to the pod. Another effect of the present embodiment is as follows. In actual semiconductor manufacturing plants, adjacent semiconductor processing apparatuses are substantially closely arranged. However, with the present configuration, the installation projected area of the semiconductor processing apparatus is not particularly affected even by addition of a latch mechanism driving unit described below. However, the present invention is not limited to the present embodiment. The latch mechanisms 5 may be arranged on the upper and lower sides, respectively, of the flange portion 2*c*. Furthermore, to increase the strength at which the lid 3 is fixed to the pod main body 2, the roller portion 5*b* may be additionally provided on at least one of the upper and lower sides of the flange portion 2*c*. Alternatively, a plurality of roller portions may be provided for one engagement recess portion 3c to ensure the above-described fixation strength, enabling a reduction in the number of engagement recess portions. Additionally, the description of the present embodiment may read that the roller portion 5b is the only component inserted through the roller portion insertion slot 2e. However, the rotating shaft 5e may be considered to be a part of the arm portion 5c. Then, a preferable definition is such that the components inserted through the roller portion insertion slot 2e are the roller portion 5b, serving as the engagement portion, and a part of the arm portion 5c and that the components inserted through the roller portion insertion slot 2e are at least the engagement portion.

Furthermore, in the present embodiment, the engagement recess portion 3c is formed of an L-shaped recessed groove including the first groove 3c1 and the second groove 3c2. However, the L shape according to the present invention embraces any form including an area corresponding to the second groove and extending in a thickness direction so that the area is in communication with the back surface of the lid 3 and an area corresponding to the first groove and extending in the direction (perpendicular to the thickness direction) of extension of the side surface of the lid 3. Various forms are possible as follows: a plurality of the second grooves may be in communication with one first groove, or the other end of the first groove which is not in communication with the second groove may be in communication with another groove and is open in the front surface of the lid. Such a continuous groove shape is expected to be effective for facilitating processing and improving the workability of cleaning.

Furthermore, in the present embodiment, means for holding the latch mechanism 5 at a latch position is replaced with elasticity provided for the peripheral surface of circular plate shape of the roller portion 5b. However, the present invention is not limited to the present embodiment. For example, an elastic member such as a spring may be coupled to the latch main body portion 5a to constantly apply a biasing force to the latch mechanism. Additionally, in the present embodiment, the roller portion 5b is used as an engaging object, and the inner side wall 3c3 of the engagement recess portion is used as a engagement member. This configuration sharply reduces the possibility that dust is generated in the engagement site. However, dust generated from what is called a rotary roller may pose a problem. Thus, a wear-resistant cylindrical abutting-contact member or the like may be used instead of the roller member 5 illustrated in the embodiment. In this case, the abutting contact member may be formed of a leaf spring or the like. In addition, in the present embodiment, even if dust is generated from the slide rail 2g, diffusion of the dust toward a mini-environment space is blocked by the flange portion 2c. Hence, the slide rail 2g is arranged on the back surface of the flange portion 2c. In this configuration, the front projected area of the pod remains unchanged. Thus, the pod can be loaded without any problem even if adjacent semiconductor manufacturing apparatuses are closely arranged. However, in order to simplify the configuration of the latch mechanism, the slide rail 2g may be arranged on the outer side surface of the flange portion 2c.

Moreover, in the present embodiment, the roller portion 5b is engaged based on the manner in which the engagement recess portion 3c is accessed through the outer peripheral surface of the flange portion 2c. This manner is effective for enabling the facilitation of processing and the visual check of the actual engagement state, allowing the slide rail 2g to be arranged away from the roller portion insertion slot 2e, and enabling an increase in the size of the roller portion 5b relative to the first groove 3c1 to increase an engagement force. However, the manner may be changed such that, for example, the engagement recess portion 3c is accessed only through the back surface side of the flange portion 2c. Furthermore, in this case, the following configuration is possible. For example, the engagement recess portion 3c is shaped like a slot composed of a first slot formed in the thickness direction of the lid 3 so as to form the second groove and a second slot communicating with the first slot and forming the first groove and formed in a direction diverted from the direction in which the first slot is formed. This slot may be arranged close to the outer periphery of the back surface 3a.

According to the pod 1 described above, the lid 3 is a planar member including only the engagement recess portion 3c on the outer peripheral surface thereof. Thus, even if the pod 1 is left in a space in which dust and the like are not controlled, the absence of a reception slot for what is called a latch key provided in the conventional configuration serves to reduce the probability of adhesion of the dust and the like and the probability that the dust and the like are stored inside the lid. Furthermore, the dust and the like can be easily removed by washing or downward flow because the dust and the like adhere mainly to a flat surface. This also eliminates the need to arrange an operation member for the latch key provided in the conventional configuration, on the surface of the door. Thus, the structure of the door can be simplified, and environmental cleanliness can be improved as result of the simplification. Additionally, when the lid 3 is fixed to the pod main body 2, the fixation can be carried out with a load placed on the lid 3 by the latch mechanism 5 so that the lid 3 is gradually pushed into the pod main body 2. Hence, even if a larger lid 3 is used, the preferable lid close-contact state can be achieved.

Now, a lid opening/closing system for a closed container corresponding to the above-described pod will be described. FIG. 1A shows that the above-described pod 1, and a pod mounting portion 121, a docking plate 123, a door 115a, a first opening portion 111, a housing wall 105a, latch mechanism driving units 131 and a flange lid 133 all included in the lid opening/closing system 101 described below. Characteristic components of the lid opening/closing system 101 are the latch mechanism driving units 131, serving as latch mechanism drive means, and the flange lid 133. In the present embodiment, each of the latch mechanism driving units 131 is formed of an actuator with a rod extended and retracted in one axial direction. When the lid 3 for the pod 1 is present at a position where the lid 3 is stuck to and held by the door 115a, the axis of the latch main body portion 5a of the latch mechanism 5 coincides with the axis of the rods of the actuators of the latch mechanism driving units 131. The rods are arranged above and below the latch main body portion 5a and opposite each other.

In other words, each of the latch mechanism driving units 131 includes the rod that can be pressed along the direction of movement of the latch mechanism 5 and the actuator configured to support the rod so that the rod can be extended and retracted along a movement axis. For example, the latch mechanism driving units 131 are arranged coaxially with or parallel to the movement axis of the latch main body portion 5a. That is, the latch mechanism driving units 131 according to the present embodiment are arranged in association with the latch mechanism 5 of the pod 1 present at a position where the lid 3 is removed and so that the latch mechanism 5 can be pressed and driven upward and downward. The axes of the rods are preferably arranged so as to coincide with the movement axis of the latch mechanism 5. The upper and lower end surfaces of the latch main body portion 5a of the latch mechanism 5 act as the above-described drive contact surfaces that are pressured surfaces. The leading ends of the rods press the pressured surface to drive the latch mechanism 5 in the axial direction.

Furthermore, the latch mechanism driving units 131 are driven by a controller described below so that the upper and lower end surfaces of the latch main body portion 5*a*, which serve as pressured surfaces, are sandwiched between the upper and lower latch mechanism driving units 131. Actuators formed of, for example, air cylinders are suitably used for the upper and lower latch mechanism driving units 131. When the pressure of the air cylinder varies between the upper and lower latch mechanism driving units 131, the latch main body portion 5*a* is sandwiched between the rods and then moved at a speed and a biasing force corresponding to the difference in pressure. In the embodiment shown in FIG. 6A or FIG. 6B, if for example, the latch main body portion 5*a* is driven by a single latch mechanism driving unit 131, a rapid and local load is applied to the lid 3. However, when the latch main body portion 5*a* is moved by using a pair of latch mechanism driving units 131 to control the speed and the like, the lid 3 can be fixed by being subjected to an appropriate load over a certain time period or longer. Thus, the pod 1 can be stably closed.

Figure 8A:
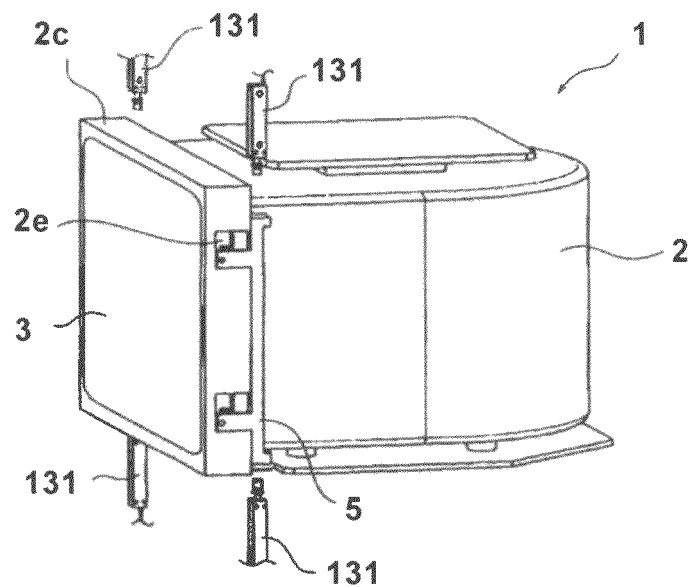
FIG. 8A is a diagram illustrating the manner of driving for the pod and a latch mechanism driving unit shown in FIG. 1A.
Figure 8B:
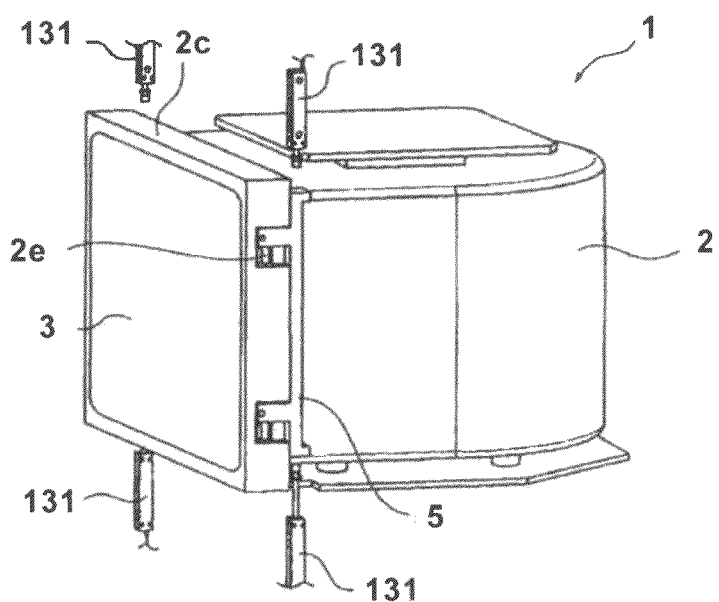
FIG. 8B is a diagram illustrating the manner of driving for the pod and the latch mechanism driving unit shown in FIG. 1A.

Now, in connection with the actual operation of opening or closing the lid 3, the sequence of operations of the latch mechanism driving unit 131 will be described with reference to FIGS. 8A to 8D. In the discussion below of the present embodiment, for facilitation of description, the upper and lower latch mechanism driving units 131 are separately driven. FIGS. 8A to 8D are perspective views showing only the pod 1 and the latch mechanism driving units 131. FIG. 8A shows that the pod 1 is located at a position where the lid 3 is opened or closed by the door 115*a*. In this state, the pressing surfaces of each of the latch mechanisms 5 are each located at a predetermined distance from the leading end of rod of the corresponding latch mechanism driving unit 131 in the axis direction. Then, the lower latch mechanism driving unit 131 starts operation. As shown in FIG. 8B, the latch mechanism driving unit 131 extends the rod to press the lower end surface of the corresponding latch main body portion 5*a* to move the latch mechanism 5 upward. Thus, the roller portion 5*b* is positioned in the second groove 3*c*2 in the engagement recess portion 3*c*. At this position, the roller portion 5*b* and the engagement recess portion 3*c* are disengaged from each other to enable the lid 3 to be removed from the pod main body 2. As described above, in the present embodiment, the roller portion 5*b* includes the elastic member arranged in the outer peripheral portion of the circular plate shape thereof and is in constant abutting contact with the inner wall surface of the engagement recess portion 3*c* under a biasing force resulting from the elasticity.

Figure 8C:
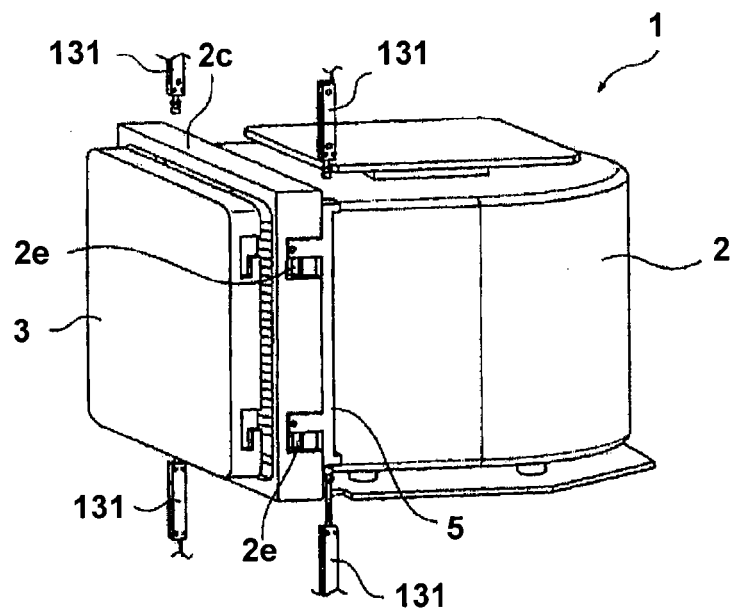
FIG. 8C is a diagram illustrating the manner of driving for the pod and the latch mechanism driving unit shown in FIG. 1A.
Figure 8D:
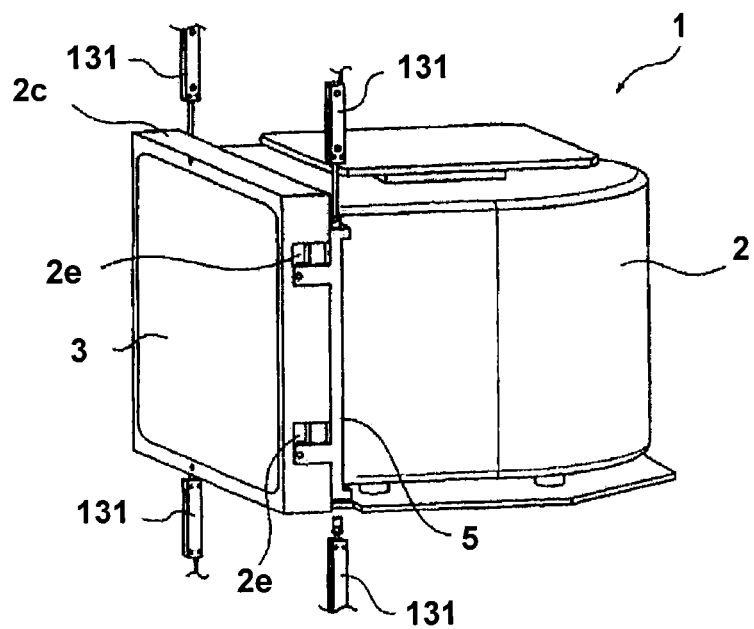
FIG. 8D is a diagram illustrating the manner of driving for the pod and the latch mechanism driving unit shown in FIG. 1A.

After the above-described state is established, the lid 3 is stuck to and held by the door (not shown in FIG. 8C). The door is then moved to remove the lid 3 from the pod main body 2. Thereafter, via the opening 2*a* in the open pod main body 2, wafers accommodated in the pod main body 2 are unloaded and wafers processed by the processing apparatus are loaded into the pod main body 2. After all the wafers are loaded into the pod main body 2, again, the door moves the lid 3 as shown in FIG. 6C, and the lid 3 then closes the opening 2. Subsequently, as shown in FIG. 8D, the lower latch mechanism driving unit 131 retracts the rod, and the upper latch mechanism driving unit 131 starts operation. The upper latch mechanism driving unit 131 extends its rod to press the upper end surface of the latch main body portion 5*a* to move the latch mechanism 5 downward. Thus, the roller portion 5*b* is positioned in the first groove 3*c*1 in the engagement recess portion 3*c*. At this position, the roller portion 5*b* and the inner side wall 3*c*3 are engaged with each other to fix the lid 3 to the pod main body 2. After the engagement is established, the upper latch mechanism driving unit 131 retracts its rod and returns to the state shown in FIG. 8A. The latch mechanism driving units 131 perform as described to achieve a series of operations starting with the removal of the lid 3 from the pod 1 and ending with the attachment of the lid 3 to the pod 1.

Figure 10:
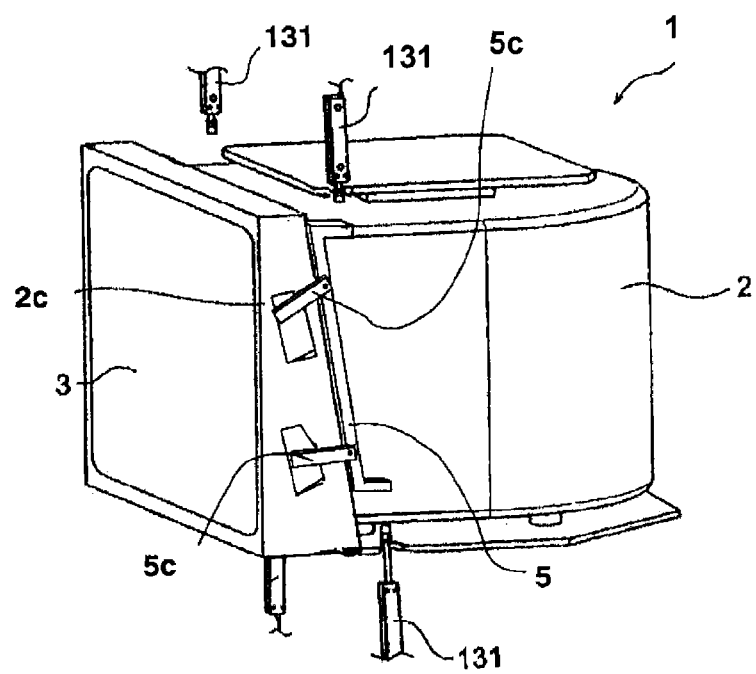
FIG. 10 is a perspective view showing a processing substrate housing container for which the latch mechanism shown in FIG. 9B is used.

As described above, the direction of movement of the latch mechanism 5 may be angular to the formation surface of the opening 2*a* as shown in FIG. 10. FIG. 10 is a perspective view showing a processing substrate housing container that uses the latch mechanism shown in FIG. 9B. That is, a surface angular to the formation surface of the opening 2*a* is formed along the outer peripheral surface of the flange portion 2*c*. The latch mechanism 5 is moved along the angular surface. The latch mechanism 5 can be moved in a direction angular to the formation surface of the opening 2*a* using a device similar to the configuration for moving the latch mechanism 5 in the vertical direction using latch mechanism driving units (3). The positional relationship between the engagement recess portion 3*c* and both the arm portion 5*c* and roller portion 5*b* of the latch mechanism 5 is as described above with reference to FIG. 9C to FIG. 9E. The latch mechanism 5 moves obliquely and angularly to the formation surface of the opening 2*a* to enable an increase in the magnitude of moving stroke of the latch mechanism 5. When the latch mechanism 5 moves to tighten the lid 3, this configuration can reduce the rate of change in the tightening force of the latch mechanism 5. Thus, precise tightening can be achieved. Here, the latch mechanism driving units 131 may be inclined to the formation surface of the opening 2*a* so that the rods of the latch mechanism driving units 131 move in a direction coaxial with or parallel to the movement axis of the latch mechanism 5.

The lid opening/closing system according to one embodiment of the present invention further includes a flange lid 133. The flange lid 133 has a cylindrical structure with an inner peripheral surface that can be placed opposite the entire outer peripheral surface of the flange portion 2*c* of the pod 2. The flange lid 133 is arranged so as to project perpendicularly from the housing wall 105*a* with respect to a side of the system where the pod 1 is arranged (external space side). When the pod 1 is placed, by the door 115*a*, at the position where the lid 3 is opened or closed, the flange lid 133 lids the outer peripheral surface of the flange portion 2*c* of the pod 2 to block a path leading from the external space directly to the outer peripheral surface. In the present embodiment, regardless of whether the latch mechanism 5 is present at the position where the latch mechanism 5 engages with the lid 3 or at the position where the latch mechanism 5 avoids engaging the lid 3, a path is present which leads from the external space to the accommodation space 2*d* of the pod main body 2 via the roller portion insertion slot 2*e*. The inside of the pod is normally maintained at what is called a positive pressure by the external space under the effect of clean gas supplied to the mini-environment space that is in communication with the inside of the pod. Thus, in the conventional art, a gas flow directed outward from the roller portion insertion slot 2*e* is generated, and the dusting problem is thus expected to be prevented. In the present embodiment, the flange lid 133 is further installed to enable minimization of the path substantially formed via the roller portion insertion slot 2*e* and leading from the accommodation space 2*d* to the external space. This also enables suppression of migration of, for example, micro dust flowing to the accommodation space 2*d* via the roller portion insertion slot 2*e* as a result of diffusion of a particle motion area.

In the above-described embodiment, the actuators that are the pair of the upper and lower latch mechanism driving units 131 are arranged for the latch main 5. This configuration enables the structure of the latch mechanism 5 to be simplified, effectively enabling a reduction in the possibility of carrying dust into the pod. However, the effects of the present invention related to the arrangement of the latch mechanism 5 can also be exerted when biasing means for applying a biasing force to the latch mechanism 5 in the axial direction is added to the latch mechanism 5, with the latch mechanism driving unit 131 arranged either above or below the latch mechanism 5. The following configuration is also possible. For example, an inclined plane as a fixed cam surface is provided which is inclined upward or downward in one direction along the direction of advancement and retraction of the docking plate 123. Cam means is provided which comes into abutting contact with the cam surface to move in conjunction with the cam surface. The latch mechanism driving units 131 may be constructed such that the rods and the like ascend and descend in response to the operation of the cam means. That is, what is called a cam mechanism may be arranged between the pod mounting platform, serving as a container mounting platform, and the latch mechanism driving unit, to drive the latch mechanism driving units. This configuration eliminates the need for a drive source configured to drive the actuators and the like.

Furthermore, in the present embodiment, the flange lid 133 is used to cover the entire flange portion 2c to prevent the direction communication between the accommodation space 2d and the external space via the roller portion insertion slot 2e. This configuration is effective, for example, for allowing the roller portion insertion slot 2e, the roller portions 5b and the like to be easily washed. However, for example, the arm portion 5c may be thinned such that both the roller portion 5b and the arm portion 5c can be accommodated in the roller portion insertion slot 2e, with the accommodation portion covered. This configuration enables the effects of the present invention to be exerted without the need to provide additional members for the lid opening/closing system.

The above-described embodiment enables the use of the closed container simply by adding the latch mechanism driving system 131 and the flange lid 133 to a conventional lid opening/closing system. Furthermore, this configuration does not particularly require a change in the actual installation projected area of the semiconductor processing apparatus. Thus, existing semiconductor manufacturing lines can be easily refurbished so as to allow the use of the closed container according to the present invention. The lid opening/closing system configured as described above enables the use of the closed container according to the present invention, allowing the above-described various effects of the closed container to be enjoyed. Although the flange lid 133 is preferably installed, placing the flange lid 133 in position may be difficult depending on the configuration of the docking plate 123 or the like. In this case, in a semiconductor manufacturing process based on conventional, what is called design rules, dust of a currently problematic size can be prevented from entering the pod by, for example, increasing the flow rate of clean gas fed from the inside of the mini-environment space into the pod.

Figure 11:
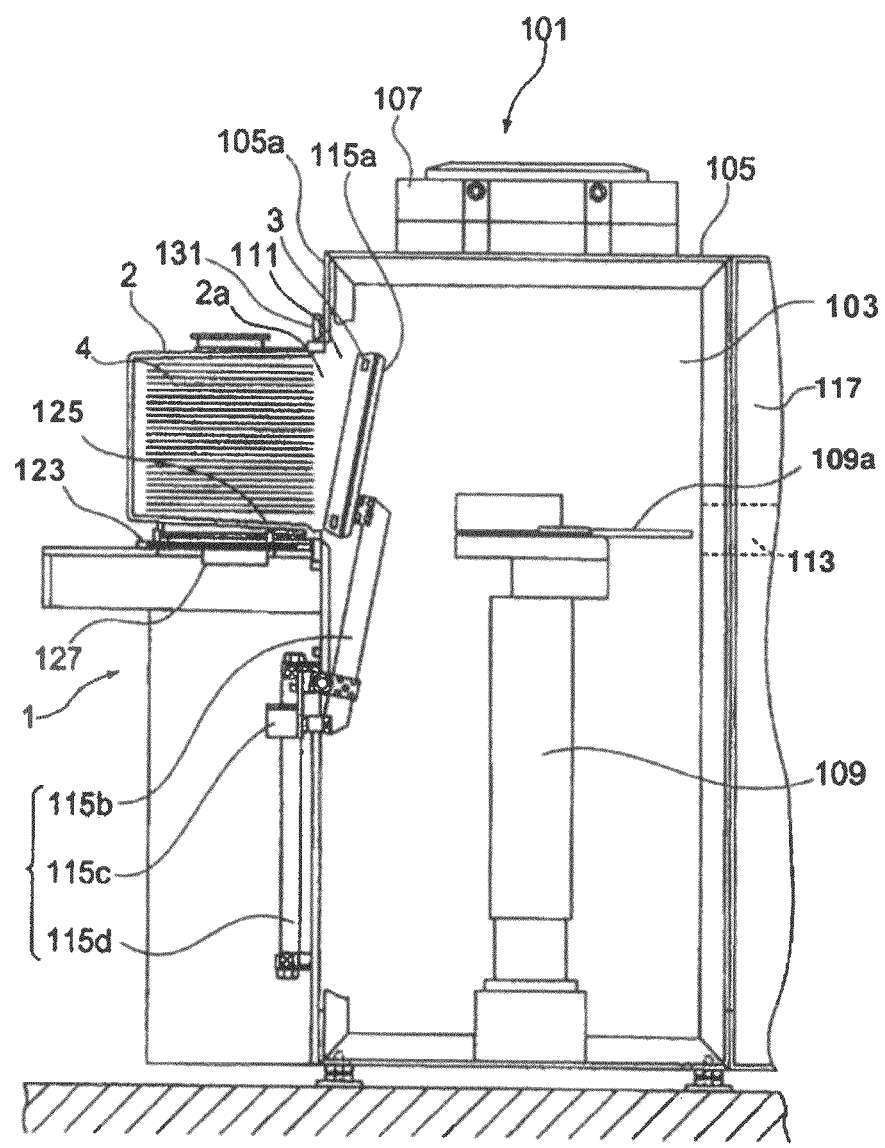
FIG. 11 is a side cross-sectional view showing a general configuration of a load port apparatus according to an embodiment of the present invention.
Figure 12:
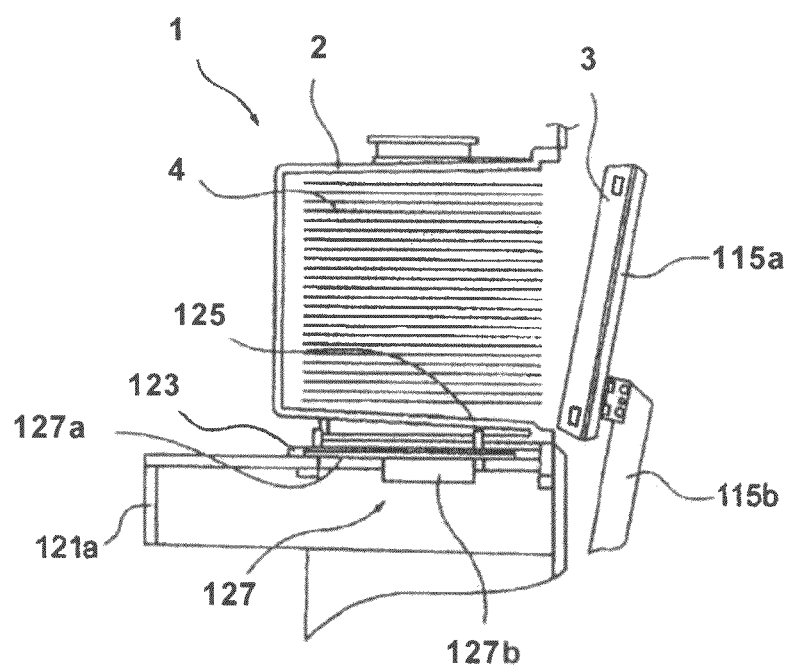
FIG. 12 is an enlarged side cross-sectional view showing a general configuration of an essential part of the load port apparatus according to the embodiment of the present invention, in a manner similar to that for FIGS. 7A and 7B.
Figure 13:
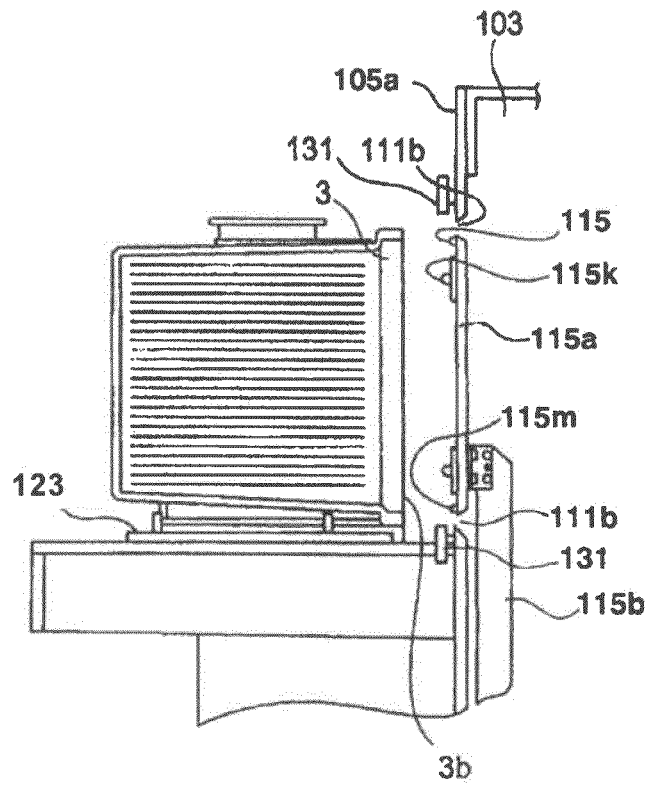
FIG. 13 is a diagram showing the configuration shown in FIG. 12 and in which the pod is present at a loading position.

Now, the lid opening/closing system associated with the closed container according to the present invention will be described. FIG. 11 is a side cross-sectional view showing a general configuration of the system. FIG. 12 is a diagram showing a pod mounting portion, a door, a pod, a lid and the like in the system 101; in the figure, these components are enlarged in a similar manner. Furthermore, FIG. 13 is a diagram schematically showing the pod mounting portion, the door and the like, with an opening in the pod closed by the lid. The lid opening/closing system 101 includes a housing 105 forming a mini-environment space 103, and the pod mounting portion 121 arranged adjacent to the housing 105. The housing 105 further includes a fan 107, a robot 109, the first opening portion 111, a second opening portion 113 and a door system 115. The fan 107 is arranged over the mini-environment space 103 via the housing 105 to introduce gas present in the space outside the housing 105, into the mini-environment space. The fan 107 includes a filter configured to remove contaminants such as dust from the gas introduced from the external space depending on the cleanliness of the external space. A structure for allowing a gas flow to flow out is arranged in the lower portion of the housing 105. Thus, dust and the like generated inside the mini-environment space 103 are carried by the gas flow and discharged from the lower portion of the housing 105 to the external space.

A robot arm 109a of the robot 109 can be projected outward from the mini-environment space via the first opening portion 111 and the second opening portion 113. The first opening portion 111 appears to be closed by the door 115a of the door system 115. However, because a gap 111b is formed between the outer periphery of the door 115a and the inner peripheral surface of the first opening portion 111, the door 115a is actually configured to enable the first opening portion 111 to be substantially, but not fully, closed. The second opening portion 113 is connected to the inside of a wafer processing apparatus 117. The details of the wafer processing apparatus 117 have no direct relationship with the present invention and will not be described. Furthermore, the latch mechanism driving mechanism 131 and the flange lid 133 have already been described and will thus not be described below. To make the drawings easily understood, the flange lid 133 is omitted from FIG. 11 to FIG. 13.

The pod mounting portion 121 includes the docking plate 123, a pod fixture system 125 and a docking plate driving system 127. The top surface of the docking plate 123 is substantially planar, and a part of the pod fixture system 125 is arranged on the top surface. The pod 1 according to the present invention is mounted on the top surface of the docking plate 123. A corresponding part of the pod fixture system 125, specifically, a pin engages with a engagement portion (not shown in the drawings) arranged on the bottom surface of the pod 1 to fix the pod at a predetermined position on the docking plate 123. The docking plate 123 is arranged such that when the pod 1 is mounted on the top surface of the docking plate 123, the main body opening 2a in the pod 1 lies opposite the first opening portion 111. The docking plate driving system 127 uses a guide rail 127a and a driving cylinder 127b to drive the pod 1 fixed to the predetermined position together with the docking plate 123, toward and away from the first opening portion 111.

The driving cylinder 127b is fixed to the mounting platform main body 121a at one end thereof and to the docking plate 123 at the other end corresponding to an extension cylinder end. The docking plate 123 is supported so as to be slidable with respect to the guide rail 127a, and slides on the guide rail 127a in response of extension and retraction of the cylinder end of the driving cylinder 127b. Here, a position where the pod 1 is externally loaded on the docking plate 123 or unloaded from the docking plate 123 is farthest from the mini-environment space 103. A position where the lid 3 is removed from the pod is closest to the mini-environment space 103.

An absorption pad 115k arranged on the surface of the door 115a is supplied with a negative pressure by a negative pressure supply 108 (see FIG. 14) through piping (not shown in the drawings) while in abutting contact with the lid 3. The absorption pad 115k then sticks to the lid 3 to enable the lid 3 to be held by the door 115a. The door system 115 includes a door arm 115b, a door opening/closing actuator 115c and door up-down mechanism 115d. The door arm 115b is formed of a bar-like member. The door arm 115b supports the door 115a at one end thereof and is coupled to the door opening/closing actuator 115c at the other end. The door arm 115b is pivotally supported at an appropriate position in an intermediate portion thereof so as to be rotatable around this position. The door arm 115b is rotated by the door opening/closing actuator 115c taking the center of rotation as an axis. One end of the door arm 115b and the door 115a supported at this end move closer to or away from the first opening portion 111. The door up-down mechanism 115d supports the door opening/closing actuator 115c and the rotating shaft of the door arm 115b. The up-down actuator and the door arm 115b the and door 115a supported by the up-down actuator are driven up and down along a guide extending in the vertical direction by the up-down actuator.

Furthermore, as shown in FIG. 13, a generally ring-like seal member 115m is arranged around the periphery of a surface of the door 115a which lies opposite the lid 3, in association with a seal surface provided on the front surface 3b of the lid 3. The seal member 115m comes into close abutting contact with the seal surface 3c when the lid 3 is stuck to and held by the absorption pad 115k arranged on the surface of the door 115a. The micro dust and the like attached to the front surface of the lid 3 is sealed in a closed space resulting from the close abutting contact. Thus, the dust and the like are prevented from diffusing to surroundings. In the present embodiment, the lid 3 is held only by the absorption pad 115k. However, a sticking and exhaust port may be provided on the door surface to discharge gas from inside a space formed by the door 115a closed by the seal member 115m, the lid 3, and the seal member 115m. This configuration enables the micro dust and the like to be forcibly removed and also enables an increase in a force exerted by the door 115a to hold the lid 3. Alternatively, the absorption pad 115k may be omitted, and the seal member 115m may be used as a kind of absorption pad.

Figure 14:
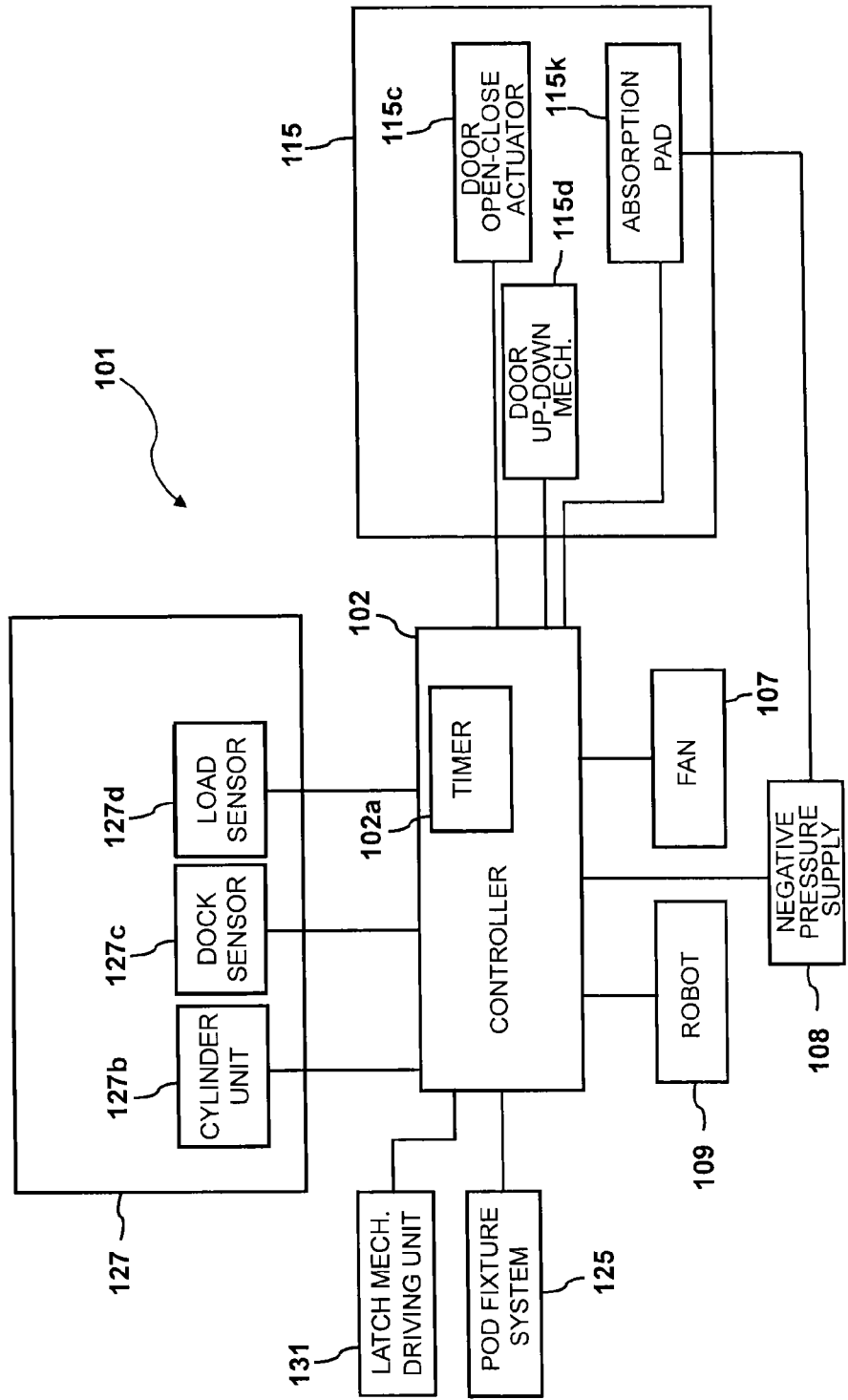
FIG. 14 is a block diagram showing a general configuration of a lid opening/closing system according to an embodiment of the present invention.

FIG. 14 is a block diagram showing a configuration of the FIMS system 101. The above-described fan 107, robot 109, door system 115, pod fixture system 125 and docking plate driving system 127 are each controlled by a controller 102. The door system 115 can independently control the door opening/closing actuator 115c and the door up-down mechanism 115d. However, in actuality, the door system 115 controls these components so that the components operate in accordance with a series of time charts controlled by the timer 102a in the controller 102. The latch mechanism driving units 131 are also controlled by the controller 102 and driven in conjunction with the above-described series of operations of the door system 115. The controller 102 performs operations of allowing the negative pressure supply 108 to supply a negative pressure to the absorption pad 115k and to stop the supply (break the negative pressure). The docking plate driving system 127 turns on and off driving of the driving cylinder 127b. It is necessary to reliably detect that the operation of the driving cylinder 127 has placed the docking plate 123 at one of two predetermined positions, that is, a position where the pod 1 is loaded and a dock position where wafers can be inserted into or removed from the pod 1.

Thus, a load sensor 127d is connected to the docking plate driving system 127 to detect that the pod 1 has been mounted on the docking plate 123 and that the docking plate 123 is present at the position where the pod 1 is to be loaded onto or unloaded from the docking plate 123. A dock sensor 127c is also connected to the docking plate driving system 127 to detect whether or not the docking plate 123 is present at the dock position. In the present invention, the lid 3 itself is very rigid and unlikely to be deformed, and the latch mechanism 5 is switched between the engaged state and the unengaged state by operation only in one axial direction. The present configuration thus sharply reduces the likelihood of misengagement of the latch mechanism 5 compared to the conventional configuration. Hence, the present embodiment is configured such that an on/off signal is provided to the latch mechanism driving mechanism 131 depending on the extension and retraction state of the rods. The on/off signal indicates whether or not the lid 3 is engaged with the pod main body 2. The embodiments of the present invention are not limited to this detection manner. For example, an optical sensor may be used to directly detect the operation of the latch mechanism 5 to determine whether or not the lid 3 is engaged.

Now, an operation of the lid opening/closing system 101 will be described which is performed during an actual wafer processing operation. In a wafer processing operation, the pod 1 in which a predetermined number of wafers accommodated and which is internally filled with clean gas is mounted on the docking plate 123. When the docking plate 123 is mounted, the pod fixture system 125 operates to mount the pod 1 at a predetermined position on the docking plate 123. Subsequently, the docking plate driving system 127 operates to drive the pod 1 toward the first opening portion 111. Specifically, the pod 1 integrated with the docking plate 123 by the pod fixture system 125 is moved by the driving cylinder 127b via the docking plate 123. At this time, the door 115a is stopped at a position where the door 115a substantially closes the first opening portion 111. The driving operation ends when the lid 3 of the pod 1 comes in abutting contact with the abutting contact surface of the door 115a to place the docking plate 123 and the first opening portion 111 in a predetermined positional relationship. At this time, the latch mechanism driving unit 131 and the latch mechanism 5 meet a predetermined positional relationship illustrated in FIG. 8A and other figures. In this state, the latch mechanism driving units 131 start operation to disengage the pod main body 2 from the lid 3. At the same time, the absorption pad 115k sticks to the lid 3, which is thus held by the door 115a. Furthermore, the space sandwiched between the surface of the lid 3 and the surface of the door 115a is closed by the seal member 115m. The controller 102 operates the door 115a, the lid 3, the latch mechanism driving units 131, the latch mechanism 5 and the pod main body 2 to so as to synchronize the operation of allowing the lid 3 to be stuck to and held by the door 115a with the operation performed by the latch mechanism driving units 131 to allow the latch mechanism 5 to disengage the lid 3 from the pod main body 2.

In the above-described state, the door opening/closing actuator 115c starts operation to pivotally move the door arm 115b to bring the door 115a holding the lid 3 to the inside of the mini-environment space 103 through the first opening portion 111. After the door arm 115b stops the pivotal movement at a predetermined angle, the door up-down mechanism 115d starts operation to move the door 115a downward together with the door opening/closing actuator 115c. This operation allows the first opening portion 111 to be fully opened. The mini-environment space 103 is thus brought into communication with the inside of the pod main body 2 via the first opening portion 111. In this state, the robot 109 starts operation to allow the robot arm 109a to convey a wafer 4 from the inside of the pod 1 to the wafer processing apparatus 117 via the second opening portion 113. With this state maintained, the robot 109 also conveys a wafer subjected to a predetermined process inside the wafer processing apparatus 117, into the pod 1. To attach the lid 3 to the pod 1 and to enable the lid opening/closing system 101 to remove the pod 1 from the lid 3, basically the above-described operations are reversed. Furthermore, in the present embodiment shown in FIG. 6A or 6B, the controller 102 operates the latch mechanism driving units 131 in synchronism with the end of movement of the lid 3 to a predetermined position with respect to the pod main body (completion of movement of the roller portion 5b to the first groove 3c1) which movement is driven by the door 115a. This enables the roller portion 5b shown in FIG. 7A or 7B to reliably perform, for example, the operation of pushing in the lid 3.

The use of the above-described pod and the above-described FIMS system serving as the lid opening/closing system associated with the pod enables suppression of the adverse effect of micro dust attached to the surface of the lid configured to close the pod opening. The use of the pod and the FIMS system also suppresses generation of dust resulting from an opening or closing operation performed when the lid is opened or closed, and diffusion of the generated dust into the mini-environment space or the pod. More specifically, the operations of fixing and unfixing the lid 3 to and from the pod main body 2 are performed on the outer side surface side of the flange portion 2c provided on the pod main body. For example, formation of gas flow from the vicinity of outer periphery of the first opening portion 111 toward the external space enables a further reduction in the possibility that micro dust and the like diffuse into the pod or the mini-environment space in addition to the reduction due to the arrangement.

In the above-described embodiment, the present invention relates mainly to the FIMS system intended for wafers. However, the application of the present invention is not limited to the FIMS system. The present invention is applicable to, for example, a closed container in which display panels, optical circular plates, or the like are accommodated.

According to the present invention, the surface of the lid is fat while the lid is fixed to the pod. Furthermore, what is called a movable member that is externally accessed and operated is not present on the lid.

This enables complete elimination of dusting resulting from operation of what is called a latch pawl on the door surface as provided in the conventional configuration. Furthermore, unlike in the case of the conventional art, the lid avoids including various internal components and is a simple planar member. Thus, dust and the like can be easily removed by washing and are prevented from adhering to the lid in a situation where removal of the dust and the like is difficult. Even the single lid can be kept very clean in terms of the dust and the like. In particular, since the engagement recess portion formed in the lid has a simple groove shape, the lid can be processed and washed much more easily than conventional types of lids. Additionally, effort is being made to shift the size of wafers used for semiconductor manufacturing process from 300 mmϕ, the current value, to 450 mmϕ. For a pod in which such large-size wafers are accommodated, a lid of the pod, which inevitably has an increased size, needs to be prevented from being deformed, for example, being warped or flexed. Furthermore, the lid needs to be more reliably fixed to the pod, with the appropriate fixation strength ensured. The lid of the pod according to the present invention has a simple planar structure and can thus adopt a structure which allows an easy reduction in the weight thereof and which also allows an increase in the rigidity thereof with the reduced weight maintained. Thus, the demand for a shift in wafer size can be easily and reliably met.

Furthermore, according to the present invention, the lid fixed to the pod main body is constantly biased in the direction in which the pod opening is closed. Moreover, with the lid fixed, what is called the latch mechanism configured to fix the lid to the pod can apply a gradually increasing biasing force to the lid in the direction in which the lid is pressed against the pod opening. This configuration can improve the airtightness of the pod itself and reduce the possibility of dusting caused by vibration of the lid during conveyance or the like. At the same time, the lid can be suitably fixed to and closely contacted with the pod without the need to increase the driving force of the door itself. This inhibits a possible rapid operation of the latch mechanism and a possible rapid application of a load to enable what is called the closure force of the door to be controlled in a stepwise fashion. Moreover, since the surface of the lid can be flat, a seal member provided on the lid or on the opposing surface of the door completely separates the space sandwiched between the lid and the door from the surrounding space. Hence, the dust, outside air and the like carried into the mini-environment space by the lid can be reliably prevented from diffusing. Moreover, not only does the door stick to and hold the lid but also the holding force of the door can be increased by reducing the pressure in the closed space formed between the lid and the door by the seal member. Additionally, the configuration for the lid opening and closing operation is arranged and operates basically outside the pod and the mini-environment space. Therefore, even if dust is generated from this configuration, the configuration acts to drastically reduce the frequency of diffusion of the dust into the pod or the mini-environment space compared to the conventional configuration.

Furthermore, in the present invention, the latch mechanism is configured to exert vertical driving and to fix the lid when located at the lower position, the lid is fixed to the pod by the weight of the latch mechanism itself. In this case, even if the configuration for operatively driving the latch mechanism malfunctions during opening or closing of the lid, the latch mechanism can constantly be present at the lid fixation position. Thus, the lid remains closed to enable the inside of the pod to be kept clean. Additionally, in the configuration disclosed in Japanese Patent Application Laid-Open No. 2001-077177, if for example, the key member and the operating portion of the latch mechanism internally cut into each other and thus become difficult to separate from each other, the lid may need to be disassembled for separation. In contrast, in the present invention, the latch mechanism is accessed through the side surface of the pod or the like, that is, from the external space side with respect to the mini-environment space, and can be forced to perform the appropriate operation. Hence, even if the latch mechanism or the like becomes abnormal and difficult to operate, the forced operation can be easily performed to enable recovery from the trouble related to the latch mechanism. Moreover, the latch state can be easily visually checked from the outside without the need to add a special configuration for detecting whether or not the latch state has been established or to establish an operation for the detection.

Moreover, according to the present invention, in the driving mechanism configured to operate the latch mechanism, an operation portion (a driving contact surface described below) for operating the latch mechanism can have an optionally set size. Thus, the present invention enables a reduction in the required accuracy of the position where the pod is stopped when the lid is opened by the door, compared to the conventional configuration. In the conventional configuration, the removal of the lid from the pod and the communication between the inside of the pod and the mini-environment space can be achieved only when the following positions are very accurately established: the lid fixation position with respect to the mounting position, the pod fixation position with respect to the opening portion, and the door abutting contact position with respect to the door based on the latch mechanism. However, the present invention serves to reduce at least the requirement for the accuracy at which the lid and the pod are stopped by the latch mechanism. Thus is effective, for example, for simplifying the configuration of an operation program for the lid opening/closing apparatus and stabilizing the actual operations.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-050311, filed Mar. 8, 2010, which is hereby incorporated by reference herein in its entirety.

What is claimed is:

1. A substrate storage pod comprising:
a pod case having an opening with a seat portion provided around a periphery thereof and an inner space with a processing substrate housed therein; and
a lid which is insertable into the opening so that a back surface of said lid is pushed onto the seat portion of said pod case so as to close and seal the opening; wherein
the pod case includes at least one latch mechanism movable in a moving direction that is angled in a direction corresponding to an inserting direction in which the lid is inserted in the opening, and the latch mechanism including at least one arm portion projecting in a direction different from the moving direction of the at least one latch mechanism and at least one engaging portion attached to a leading end of the at least one arm portion,
the lid comprises at least one engagement portion on at least one side surface of the lid, the at least one engagement portion including a first groove having a first inclined inner wall and a second groove extending from a side of the back surface of the lid and communicating with the first groove at a communicating portion substantially opposite to the side of the back surface, wherein a distance between the surface of the first inclined inner wall of the first groove and the back surface of the lid increases according to an increase in distance from the communicating portion,
when the lid is inserted into the opening, the at least one engaging portion of the at least one latch mechanism first enters in the second groove and moves toward the communicating portion, and
when the at least one latch mechanism is moved in the moving direction after the lid is inserted into the opening, the at least one engaging portion of the at least one latch mechanism moves into the first groove to an end side to press the first inclined inner wall toward the seat portion so that the lid is pressed against and firmly fixed to the seat portion.

2. A substrate storage pod according to claim 1, wherein the moving direction of the at least one latch mechanism is movement in a direction angular to the back surface of the lid completely fitted into the opening by insertion.

3. A substrate storage pod according to claim 1, wherein the moving direction of the at least one latch mechanism is angled with a surface of the opening.

4. A substrate storage pod according to claim 1, wherein
the at least one arm portion is attached to a main body portion of the at least one latch mechanism, and
the at least one arm portion includes an elastic member that applies a biasing force in a direction in which the at least one engaging portion of the at least one latch mechanism moves closer to the main body portion of the at least one latch mechanism.

5. A substrate storage pod according to claim 1, wherein
the at least one arm portion is attached to the at least one latch mechanism so as to be pivotally movable around a pivotal axis, and
after the at least one engaging portion of the at least one latch mechanism enters the first groove, the at least on arm portion is biased around the pivotal axis in a direction in which the surface of the first inclined inner wall of the first groove moves closer to the at least one latch mechanism.

6. A substrate storage pod according to claim 1, wherein:
the first groove includes a second inclined inner wall adjacent to the first inclined inner wall, and
a distance between a surface of the second inclined inner wall and the back surface of the lid increases according to an increase in distance from the end side of the first groove to a connection point of the first inclined wall and the second inclined wall.

7. A substrate storage pod according to claim 1, wherein the at least one engaging portion of the at least one latch mechanism comprises a circular-plate-shaped roller that is rotatable in abutting contact with a surface of the first inclined inner wall.

8. A substrate storage pod according to claim 1, wherein the at least one latch mechanism further comprises biasing means for applying a biasing force to the at least one engaging portion of the at least one latch mechanism to stop and hold the at least one engaging portion of the at least one latch mechanism at a position where the at least one engaging portion of the at least one latch mechanism engages with the at least one engagement portion of the lid.

9. A substrate storage pod according to claim 1, wherein the pod case comprises at least one slide rail configured to support the at least one latch mechanism in such a manner that the at least one latch mechanism is movable.

10. A lid opening/closing system configured to open and close a lid of a substrate storage pod comprising the lid and the pod case, and to enable housing and removal of an accommodation object to be accommodated inside the pod case, the lid opening/closing system comprising:
the substrate storage pod according to any one of claims 1 to 5;
a mini-environment having an opening portion;
a door movable between a position where the door closes the opening portion and a position where the door opens the opening portion; and
a latch driving mechanism that enables the at least one latch mechanism to be operated when the substrate storage pod is located at a position where the lid is opened or closed by the door, the latch driving mechanism being arranged around a periphery of the opening.

11. A lid opening/closing system according to claim 10, wherein the latch driving mechanism comprises at least one rod configured to press the at least one latch mechanism, and at least one actuator configured to support the at least one rod so as to allow the at least one rod to extend and retract with respect to the pod case.

* * * * *